(12) United States Patent
Thomas et al.

(10) Patent No.: US 8,859,423 B2
(45) Date of Patent: Oct. 14, 2014

(54) NANOSTRUCTURED ELECTRODES AND ACTIVE POLYMER LAYERS

(75) Inventors: Jayan Thomas, Orlando, FL (US); Nasser N. Peyghambarian, Tucson, AZ (US); Robert A. Norwood, Tucson, AZ (US); Palash Gangopadhyay, Tucson, AZ (US); Akram A. Khosroabadi, Tucson, AZ (US)

(73) Assignee: The Arizona Board of Regents on behalf of the University of Arizona, Tucson, AZ (US)

( * ) Notice: Subject to any disclaimer, the term of this patent is extended or adjusted under 35 U.S.C. 154(b) by 20 days.

(21) Appl. No.: 13/816,480

(22) PCT Filed: Aug. 11, 2011

(86) PCT No.: PCT/US2011/047474
§ 371 (c)(1),
(2), (4) Date: Feb. 11, 2013

(87) PCT Pub. No.: WO2012/021739
PCT Pub. Date: Feb. 16, 2012

(65) Prior Publication Data
US 2013/0143414 A1 Jun. 6, 2013

Related U.S. Application Data

(60) Provisional application No. 61/401,309, filed on Aug. 11, 2010.

(51) Int. Cl.
*H01L 21/44* (2006.01)
*H01B 13/00* (2006.01)
(Continued)

(52) U.S. Cl.
CPC ............ *H01L 21/0226* (2013.01); *H01L 33/38* (2013.01); *H01L 33/18* (2013.01); *H01L 33/24* (2013.01); *H01B 13/0036* (2013.01); *H01L*
(Continued)

(58) Field of Classification Search
CPC  Y02E 10/50; B82Y 40/00; H01L 31/022425; H01L 29/0665; H01L 31/1884; H01L 21/0226; H01L 2933/0016; H01L 29/0676; H01L 31/0224; H01L 35/24; H01L 51/0034; H01L 51/0044; H01L 51/441
USPC ............ 257/E31.124, E51.027; 438/98, 666; 977/932, 890
See application file for complete search history.

(56) References Cited

U.S. PATENT DOCUMENTS 6,538,194 B1  3/2003  Koyanagi et al.
7,145,071 B2  12/2006  Spivack et al.
(Continued)

FOREIGN PATENT DOCUMENTS

WO    WO 2008/096335    8/2008

OTHER PUBLICATIONS

Goh et al., "Nanostructuring Titania by Embossing with Polymer Molds Made from Anodic Alumina Templates", *Nano Letters*, vol. 5, 8:1545-1549, 2005.

(Continued)

*Primary Examiner* — Bac Au
(74) *Attorney, Agent, or Firm* — Klarquist Sparkman, LLP

(57) ABSTRACT

Embodiments of methods for fabricating polymer nanostructures and nanostructured electrodes are disclosed. Material layers are deposited onto polymer nanostructures to form nanostructured electrodes and devices including the nanostructured electrodes, such as photovoltaic cells, light-emitting diodes, and field-effect transistors. Embodiments of the disclosed methods are suitable for commercial-scale production of large-area nanostructured polymer scaffolds and large-area nanostructured electrodes.

20 Claims, 9 Drawing Sheets

(51) Int. Cl.
  *H01L 21/02* (2006.01)
  *H01L 31/0224* (2006.01)
  *H01L 31/0236* (2006.01)
  *H01L 31/0392* (2006.01)
  *H01L 51/00* (2006.01)
  *H01L 33/38* (2010.01)
  *H01L 33/18* (2010.01)
  *H01L 33/24* (2010.01)
  *H01L 33/08* (2010.01)
  *H01L 33/28* (2010.01)
  *H01L 33/00* (2010.01)

(52) U.S. Cl.
  CPC . 2933/0016 (2013.01); *H01L 33/08* (2013.01); *H01L 33/28* (2013.01); *H01L 31/022466* (2013.01); *H01L 31/02366* (2013.01); *H01L 31/0392* (2013.01); *H01L 33/0087* (2013.01); *H01L 51/0021* (2013.01); *Y02E 10/549* (2013.01); *Y10S 977/89* (2013.01); *Y10S 977/932* (2013.01)
  USPC 438/666; 438/98; 257/E31.124; 257/E51.027; 977/890; 977/932

(56) References Cited

U.S. PATENT DOCUMENTS

| | | | |
|---|---|---|---|
| 7,462,774 | B2 | 12/2008 | Roscheisen et al. |
| 7,511,217 | B1 | 3/2009 | Roscheisen et al. |
| 7,605,327 | B2 | 10/2009 | Roscheisen et al. |
| 2004/0112421 | A1 | 6/2004 | Spivack et al. |
| 2006/0024936 | A1 | 2/2006 | Brabec et al. |
| 2007/0025139 | A1 | 2/2007 | Parsons |
| 2007/0119048 | A1 | 5/2007 | Li et al. |
| 2008/0096335 | A1 | 4/2008 | Joselevich et al. |
| 2009/0092747 | A1 | 4/2009 | Zhamu et al. |
| 2009/0173931 | A1 | 7/2009 | Stumbo |
| 2009/0179138 | A1* | 7/2009 | Guo et al. ............. 249/114.1 |
| 2009/0266418 | A1 | 10/2009 | Hu et al. |
| 2010/0068461 | A1 | 3/2010 | Wallace et al. |
| 2010/0090341 | A1* | 4/2010 | Wan et al. .................. 257/749 |
| 2010/0096004 | A1 | 4/2010 | Hu et al. |
| 2010/0147365 | A1* | 6/2010 | DeSimone et al. ........... 136/255 |
| 2011/0048518 | A1 | 3/2011 | Yang et al. |
| 2011/0203656 | A1* | 8/2011 | Kuang et al. ............. 136/256 |
| 2013/0177598 | A1* | 7/2013 | Desimone et al. ........... 424/400 |

OTHER PUBLICATIONS

Williams et al., "Nanostructured Titania-Polymer Photovoltaic Devices Made Using PFPE-Based Nanomolding Techniques", *Chem. Mater*, 20:5229-5234, 2008.

McGehee et al., "Nanostructured Photovoltaic Cells", pp. 1-13, 2008.

* cited by examiner

NANOSTRUCTURED ELECTRODES AND ACTIVE POLYMER LAYERS

CROSS REFERENCE TO RELATED APPLICATION

This is the U.S. National Stage of International Application No. PCT/US2011/047474, filed Aug. 11, 2011, which was published in English under PCT Article 21(2), which in turn claims the benefit of the earlier filing date of U.S. Provisional Application No. 61/401,309, filed on Aug. 11, 2010, which is incorporated in its entirety herein by reference.

ACKNOWLEDGMENT OF GOVERNMENT SUPPORT

This invention was made with government support under NRO000-07-C-0030 awarded by the United States Department of Defense/National Reconnaissance Office. The government has certain rights in the invention.

FIELD

This disclosure relates to nanostructured electrodes and active polymer layers.

BACKGROUND

Metal and metal oxide electrodes play a significant role in many state-of-the art high-tech applications including photonics, membranes, biological supports, sensing, electrochromics, and in various green technologies, such as, photocatalytics, Li-ion batteries and photovoltaics. Forming nanostructures on an electrode surface is a technique used to increase the surface area of an electrode. Nanostructured metals and metal oxides have been fabricated using oblique incidence deposition, traditional photolithography, solution-phase and hydrothermal growth of crystalline rods, oxidation or anodization of metal foils, and vapor-phase growth of metal oxides. Existing methods for nanostructuring electrodes typically are difficult, time-consuming, costly, resource-wasteful, and/or lacking in reproducibility. Additionally, some methods use a sacrificial template to form the nanostructures, necessitating a new template for each nanostructured unit produced.

SUMMARY

Embodiments of a method for manufacturing a nanostructured electrode are disclosed. In some embodiments, the method includes (i) providing a reusable mold having a pattern of nano-concavities corresponding to a desired pattern of nanofeatures, (ii) filling the mold with a polymer, (iii) heating the mold at a sufficient temperature for a sufficient time period to produce a mold containing nanoarchitectured polymer comprising a plurality of convex nanofeatures corresponding to the pattern of nano-concavities, (iv) providing a coated substrate having a thin film of the polymer on a first surface of the substrate, (v) contacting the thin film of the polymer on the substrate with the mold containing the nanoarchitectured polymer such that the nanoarchitectured polymer contacts and adheres to the coated substrate in the absence of adhesive materials, (vi) removing the mold, thereby transferring the nanoarchitectured polymer from the mold to the thin film of the polymer on the substrate, and (vii) depositing a first electrode material onto the nanoarchitectured polymer to form a continuous electrode coating, thereby producing the nanostructured electrode. In certain embodiments, the mold containing the nanoarchitectured polymer is contacted to the thin film of polymer on the substrate without applied pressure. In some embodiments, the nanoarchitectured polymer is thermally cured before depositing the first electrode material.

In certain embodiments, the polymer is optically transparent at AM 1.5. In particular embodiments, the substrate is optically transparent. In some embodiments, the electrode coating has an average thickness of 10-200 nm on top of the nanofeatures.

In some embodiments the nano-concavities have an average diameter of 50-150 nm, and an average depth of 100-500 nm. In certain embodiments, the nano-concavities have vertical side walls. In some embodiments, the corresponding nanofeatures have an aspect ratio (height to diameter) of from 1 to 10. The nanofeatures may have a center-to-center spacing that ranges from 1× to 1.6× an average diameter of the nanofeatures. In some embodiments, the nanostructured electrode has nanofeatures spaced 6-300 nm apart. In particular embodiments, the nanofeatures are nanopillars.

In some embodiments, the substrate has a larger surface area than the mold such that the coated substrate comprises a plurality of regions and the mold contacts only one region of the coated substrate. For each of the previously uncontacted regions of the coated substrate, the method further includes steps of (i) refilling the mold with polymer, (ii) reheating the mold at a sufficient temperature for a sufficient time period to produce a mold containing nanoarchitectured polymer, (iii) contacting a previously uncontacted region of the coated substrate with the mold such that the nanoarchitectured polymer contacts and adheres to the previously uncontacted region of the coated substrate in the absence of adhesive material, and removing the mold, thereby transferring the nanoarchitectured polymer from the mold to the previously uncontacted region of the coated substrate, before depositing the first electrode material.

Embodiments of the disclosed method can be used to manufacture a commercial-scale quantity of nanostructured electrodes. In certain embodiments, the method further includes manufacturing a photovoltaic cell, a light-emitting diode, or a field-effect transistor including the nanostructured electrode.

In some embodiments, filling the mold with a polymer includes filling the mold with a solution comprising a polymer and a solvent. The mold may be heated at a sufficient temperature for a sufficient time period to evaporate at least a portion of the solvent, thereby producing a mold containing nanoarchitectured polymer. In certain embodiments, the polymer is polyacrylonitrile. The solution may include 1-40 wt % polyacrylonitrile, such as 20-40 wt % polyacrylonitrile in dimethylformamide. In some embodiments, the solution is heated at a sufficient temperature for a sufficient period of time to partially cyclize the polyacrylonitrile before filling the mold.

In some embodiments, the method further includes depositing an organic material onto the electrode coating to produce an organic material layer, and depositing a second electrode material onto the organic material layer to produce a second electrode layer. In certain embodiments, a sufficient quantity of organic material is deposited to substantially fill spaces between the nanofeatures and form a layer of organic material over the nanofeatures. The layer of organic material over the nanofeatures may have a thickness of 20-200 nm.

In some embodiments, the organic material is a bulk heterojunction organic material. The bulk heterojunction organic material may include a mixture of poly(3-hexylthiophene) (P3HT) and substituted fullerenes. In certain embodiments, the substituted fullerenes are provided by [6,6]-phenyl C61 butyric acid methyl ester (PCBM).

In some embodiments, a first organic layer including an organic donor material is deposited onto the first electrode coating, and a second organic layer including an organic acceptor material is deposited onto the first organic layer, wherein the first organic layer and second organic layer together include a sufficient quantity of organic material to fill spaces between the plurality of nanofeatures and form a layer of organic material over the nanofeatures. In certain embodiments, the organic donor material is phthalocyanine, oligoacenes, or a combination thereof. In particular embodiments, the organic acceptor material includes substituted fullerenes.

When there is a first electrode material and a second electrode material, one of electrode materials is a hole collector material (e.g., silver, indium tin oxide, or indium zinc oxide) and the other electrode material is an electron collector material (e.g., aluminum). In some embodiments, the first electrode material is an electron collector material, the second electrode material is a hole collector material, and the method further includes depositing an inorganic semiconductor material onto the electrode coating before depositing the organic material. In certain embodiments, the inorganic semiconductor material includes Si or CdSe. Suitable organic materials include polythiophene.

In some embodiments, the method includes depositing a first semiconductor layer onto the electrode coating, depositing a second semiconductor layer onto the first semiconductor layer, and depositing a second electrode material onto the second semiconductor layer to produce a second electrode layer. When the first electrode material is a hole collector material, the second electrode material is an electron collector material. In certain embodiments, the hole collector material is indium tin oxide, and the electron collector material is aluminum. In some embodiments, depositing the first semiconductor layer includes depositing a thin film of a solution comprising CdTe and a solvent onto the electrode coating to form the first semiconductor layer and removing the solvent. In certain embodiments, the second semiconductor layer is a layer of CdSe deposited onto the first semiconductor layer.

In some embodiments, the method further includes removing the nanostructured electrode from the substrate, and transferring the nanostructured electrode to another substrate for use in a photovoltaic cell, a light-emitting diode, or a field effect transistor. Before or after removing the nanostructured electrode from the substrate, the nanostructured electrode may be cleaved to produce a plurality of smaller nanostructured electrodes.

Embodiments of a method for forming a nanostructured scaffold that can be used for fabrication of metal and/or metal oxide electrodes include (i) providing a reusable mold having a pattern of nano-concavities corresponding to a desired pattern of nanofeatures; (ii) providing a solution comprising 20-40 wt % polyacrylonitrile and a solvent; (iii) heating the solution at a sufficient temperature for a sufficient period of time to produce partially cyclized polyacrylonitrile; (iv) filling the mold with the partially cyclized polyacrylonitrile; (v) evaporating at least a portion of the solvent produce a mold containing nanoarchitectured polyacrylonitrile; (vi) providing a coated substrate having a thin film of polyacrylonitrile on a first surface of the substrate, wherein the substrate has a larger planar surface area than the mold; (vii) contacting a first region of the thin film of polyacrylonitrile on the substrate with the mold containing the nanoarchitectured polyacrylonitrile such that the nanoarchitectured polyacrylonitrile contacts and adheres to the first region in the absence of adhesive material; (viii) removing the mold, thereby transferring the nanoarchitectured polyacrylonitrile from the mold to the first region; (ix) for each of a plurality of subsequent regions performing steps of (a) refilling the mold with partially cyclized polyacrylonitrile, (b) evaporating at least a portion of the solvent to produce a mold containing nanoarchitectured polyacrylonitrile, (c) contacting a subsequent region of the thin film of polyacrylonitrile on the substrate with the mold containing the nanoarchitectured polyacrylonitrile such that the nanoarchitectured polyacrylonitrile contacts and adheres to the subsequent region in the absence of adhesive material, and (d) removing the mold, thereby transferring the nanoarchitectured polyacrylonitrile from the mold to the subsequent region; and (x) after nanoarchitectured polyacrylonitrile has been transferred to each of the plurality of subsequent regions, thermally curing the nanoarchitectured polyacrylonitrile. In some embodiments, the method further includes depositing at least one metal or metal oxide layer onto the nanostructured scaffold to form a coating, thereby producing a nanostructured electrode. In certain embodiments, the method also includes manufacturing a photovoltaic cell, a light-emitting diode, or a field-effect transistor including the nanostructured scaffold. In particular embodiments, the mold has a planar surface area of 10 $mm^2$ to 20 $mm^2$ and the substrate has a planar surface area from 2× to 1,000× larger than the mold.

The foregoing and other objects, features, and advantages of the invention will become more apparent from the following detailed description, which proceeds with reference to the accompanying figures.

BRIEF DESCRIPTION OF THE DRAWINGS

FIG. 10A is 150-nm indium tin oxide on PAN nanopillars; FIG. 10B is 100-nm silver on PAN nanopillars; FIG. 10C is magnified view of FIG. 10B.

DETAILED DESCRIPTION

Figure 1:
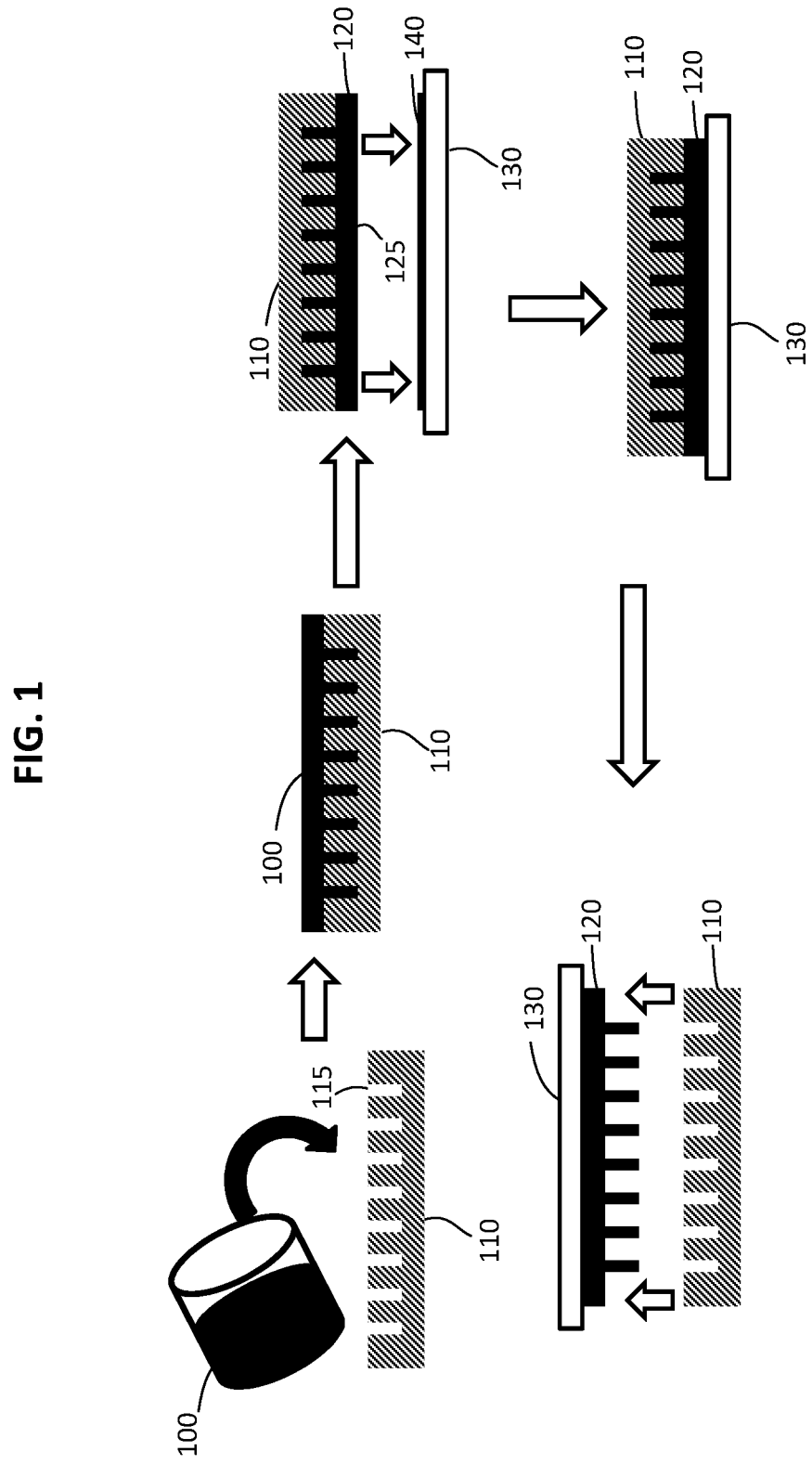
FIG. 1 is a schematic diagram illustrating one embodiment of a method for making a nanostructured polymer.

There is a need (e.g., in the areas of photovoltaic cells, light-emitting diodes, and field-effect transistors) for nanoscale metal and metal oxide electrode structures that provide high surface area, tunability of electrode—organic interfaces, and low tortuosity for improved electron/hole transport characteristics. Tailored nanoscale interfaces facilitate generation and dissociation processes of excitons along with selective transport and collection of charges at the electrodes in many donor-acceptor devices. In photocatalytic, photoelectrolysis, and photovoltaics applications, including nanostructured organic solar cells, these structures can provide a means to increase efficiency in transport limited systems by allowing radial transport to occur perpendicular to light absorption.

Disclosed herein are embodiments of methods to fabricate polymer nanostructures that can be further deposited with a wide variety of other materials, such as metal and metal oxide materials to form nanostructured electrodes. Embodiments of devices comprising nanostructured polymer layers also are disclosed. The methods can be used to produce nanostructured polymer-based electrodes particularly suitable for solar cells. Embodiments of the disclosed nanoarchitectured polymers have great versatility and can be used in a variety of devices. In one embodiment, the nanoarchitectured polymers are formed or deposited onto a substrate having desired characteristics for one or more end uses. In another embodiment, the nanoarchitectured polymer may be formed on one substrate and subsequently transferred to virtually any other substrate, such as a substrate suitable for use in a desired device. In certain embodiments, large-scale nanoarchitectured polymer scaffolds are formed and subsequently can be cut or cleaved into a plurality of smaller nanoarchitectured polymer scaffolds.

The ability to create various metal and transparent conducting oxide (TCOs) nanopatterns using a high aspect ratio thermally stable polymer nanostructure as a common scaffold holds a number of advantages. Embodiments of the disclosed methods and devices provide facile integration with device and TCO manufacturing processes, lower operating and start-up materials costs, and/or high throughput manufacturing including roll-to-roll production. Additionally, since the nanostructuring is done before the actual device fabrication, there is no need to break the vacuum (unlike the active material nanostructuring in some cases) during the fabrication process of many atmosphere-sensitive devices. In certain embodiments, the methods disclosed herein are used to produce commercial-scale quantities of nanostructured electrodes. Conventional photolithography can produce about 1-2 nanostructured electrodes per day. In contrast, embodiments of the disclosed methods may be used to produce several hundred nanostructured electrodes per day. It was surprisingly discovered that dimensions and distribution of the patterns in the nanostructured electrodes (NSEs) are tunable by varying the deposited metal or metal oxide layer thickness, which in turn allows a greater control over the optical and electrical properties of the NSEs.

I. Terms and Abbreviations

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of ingredients, properties such as molecular weight, percentages, and so forth, as used in the specification or claims are to be understood as being modified by the term "about." Unless otherwise indicated, non-numerical properties or method steps such as orientations (e.g., vertical) or process steps like curing, or properties such as homogeneous or continuous, and so forth as used in the specification or claims are to be understood as being modified by the term "substantially," meaning to a great extent or degree. Accordingly, unless otherwise indicated, implicitly or explicitly, the numerical parameters and/or non-numerical properties and method steps set forth are approximations that may depend on the desired properties sought, limits of detection under standard test conditions/methods, limitations of the processing method, and/or the nature of the parameter or property. When directly and explicitly distinguishing embodiments from discussed prior art, the embodiment numbers, properties and method steps are not approximates unless the word "about" is recited.

In order to facilitate review of the various embodiments of the disclosure, the following explanations of specific terms are provided:

Air Mass Coefficient (AM): The air mass coefficient (AM) defines the direct optical path length through the Earth's atmosphere, expressed as a ratio relative to the path length vertically upwards. AM is commonly used to characterize the performance of solar cells under standardized conditions. "AM1.5", 1.5 atmosphere thickness, corresponds to a solar zenith angle of z=48.2°. While the summertime AM number for mid-latitudes during the middle parts of the day is less than 1.5, higher figures apply in the morning and evening and at other times of the year. Therefore AM 1.5 is useful to represent the overall yearly average for mid-latitudes, and the solar industry uses AM1.5 for standardized testing of terrestrial solar panels Anode: With respect to a solar cell, an anode is an electrode towards which positively-charged holes migrate. An organic or inorganic/organic hybrid solar cell includes an electron donor material and an electron acceptor. When photons strike the solar cell, excitons (i.e., electron-hole pairs) are generated. Excitons can form in either the donor material or the acceptor material. In an organic solar cell, excitons typically form primarily in the donor material. As the excitons diffuse and reach a donor-acceptor junction, the charges separate and the positively-charged holes migrate through the donor material toward the anode.

Aspect ratio: A ratio of height to diameter. As aspect ratio increases, surface area increases. For example, a 100-nm diameter pillar nanostructure with 100-nm height, an aspect ratio of 1, and 120-nm pitch has surface area about three-fold larger than a non-patterned, planar surface.

Cathode: With respect to a solar cell, a cathode is an electrode towards which electrons migrate. An organic or inorganic/organic hybrid solar cell includes an electron donor material and an electron acceptor. When photons strike the solar cell, excitons (i.e., electron-hole pairs) are generated. Excitons can form in either the donor material or the acceptor material. In an organic solar cell, excitons typically form primarily in the donor material. As the excitons diffuse and reach a donor-acceptor junction, the charges separate and the electrons migrate through the acceptor material toward the cathode.

CCE: Charge collection efficiency.

Conformal: Maintaining true shape over a small area and scale in every direction. As used herein, a conformal coating is a coating layer that maintains the shape of the underlying structure.

EDE: Exciton dissociation efficiency.

Exciton: An exciton is an electrically neutral quasiparticle (a quantum of energy that position and momentum, and can in some respects be regarded as a particle) comprising an electron and a hole.

Hole: The term "hole" describes the lack of electron at a position where an electron could exist in an atom or an atomic lattice. In a semiconductor, a hole in a valence band is generated when an electron moves from the valence band to the conduction band. Hole conduction occurs when a hole "moves" through the valence band, i.e., when another electron in the valence band moves to fill the hole, thereby generating a new hole.

LED: Light-emitting diode.

Nanoarchitectured/nanopatterned/nanostructured: A "nanoarchitectured," "nanopatterned," or "nanostructured" system or device includes one or more nanoscale features ("nanofeatures") of interest, formed by executing a nanoimprinting or nanomolding process, that has at least one dimension ranging from the size of individual atoms or molecules (Ångstroms) to about 200 nanometers (nm). For example, a nanopillar or nanopost may have a diameter of 200 nm and a length of 500 nm or more, and is still regarded as a nanofeature because of its diameter. A nanoarchitectured or nanostructured system comprises multiple nanofeatures of a desired configuration(s) on at least one surface thereof. The nanofeatures can be ordered or arrayed in a particular pattern or distribution on the surface. An example of a nanofeature is a nanopillar in a formed array thereof.

Nano-concavity: As used herein, the term "nano-concavity" refers to a nanoscale recess in a mold. In some embodiments, the nano-concavity has a cylindrical shape with a high aspect ratio, i.e., a height-to-diameter ratio ranging from 1 to 20, such as from 1 to 10, 1 to 7, 1 to 5, or 5 to 10.

Nanoimprinting/nanomolding: A process of forming a desired cast nanoscale pattern of a substance by contacting a liquid or castable form of a substance with a nanoscale pattern-defining object (e.g., a mold or template). The mold includes "nanofeatures," e.g., features having at least one nanoscale dimension, such as at least one dimension that is less than or equal to 200 nm. In certain embodiments the nanofeatures defined by the mold are nano-concavities. The substance and mold are brought together, resulting in replication of the pattern on a surface of the substance, wherein nano-concavities on the mold produce nano-convexities on or in the substance. For example, nanoholes in the mold are used to form the substrate into nanopillars.

NSE: Nanostructured electrode.

OLED: Organic light-emitting diode in which the emissive layer is a film of organic compounds that emit light when excited by an electric current.

Oligoacene: An oligomeric acene compound. Acenes are polycyclic aromatic hydrocarbons made up of linearly fused benzene rings having a general structure:

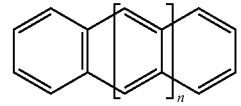

Representative oligoacenes include tetracene and pentacene.

PAE: Photon absorption efficiency.

PCE: Power conversion efficiency.

Pitch: The term "pitch" refers to the distance between adjacent nanofeatures, e.g., nanorods, nanopillars, etc. Typically, pitch is measured horizontally center-to-center, i.e., from the center of one nanofeature to the center of the adjacent nanofeature.

Polymer: A molecule of repeating structural units (e.g., monomers) formed via a chemical reaction, i.e., polymerization.

Polymerization is a chemical reaction, usually carried out with a catalyst, heat or light, in which a large number of relatively simple molecules (monomers) combine to form a chainlike macromolecule (a polymer). The chains further can be combined, or crosslinked, by the addition of appropriate chemicals.

Solution: A homogeneous mixture composed of two or more substances. A solute (minor component) is dissolved in a solvent (major component).

TCO: Transparent conducting oxide.

II. Methods of Making Nanopatterned Devices

Embodiments of methods of making nanopatterned devices include forming a nanostructured, or nanoarchitectured, polymer layer that subsequently is used as a support or base upon which one or more material layers are deposited. Nanometer-sized pillars or any other suitable nanostructures can be fabricated on or in a surface of a polymer layer by nanomolding. A nanopatterned mold is used to form the nanostructured polymer layer. Other materials, such as electrode materials, can be deposited on top of these structures by vacuum deposition or other deposition techniques. Additional layers can be deposited onto the nanostructures to form solar cells or other devices.

A. Molds for Making Nanostructured Polymers

The mold is a nanopatterned device used for forming nanostructured, or nanoarchitectured, polymer nanofeatures. In some embodiments, at least one surface of the mold is patterned using electron-beam lithography to create nanosized concavities (e.g., nanoholes). Each nano-concavity is positioned, sized, and shaped to form a corresponding convex nanofeature having a desired size, shape, and position relative to other nanofeatures of the intended nanostructure. For example, the nano-concavities can be configured to form an array of cylindrical or polygonal nanoposts, nanorods, or nanopillars having desired diameters, lengths, and/or aspect ratios. Thus, upon the mold and polymer being brought together, the array of nano-concavities in the mold forms the polymer into a corresponding array of nano-convexities ("nanofeatures"). In other words, the mold is used for forming or casting at least a portion of the polymer into the desired nanofeatures.

In certain embodiments the mold is made of a rigid and inert material (e.g., silica, silicon carbide, aluminum). The molds are preferably formed of materials suitable for cleanroom use. The molds used in certain of the embodiments of the disclosed methods are durable and capable of being reused multiple times. The mold remains intact and can be reused multiple times, even hundreds or more times such as more than 100 times, more than 200 times, or even more than 500 times. For example, a single mold can be used to produce a large number of individual nanoarchitectured structures. In other embodiments a single mold can be used to nanomold multiple respective regions on a polymer layer having a planar surface area larger than the mold dimensions. For instance, a 2 cm×2 cm mold can be used four times to completely nanomold a 4 cm×4 cm polymer layer. Thus, the methods disclosed herein are readily used in automated processes in which multiple nanoarchitectured structures are produced on a commercial scale, continuously, consistently, reliably, efficiently and in an economically effective manner.

Examples of nanofeatures formed by the mold include cylindrical (rod-shaped) and polygonal (pillars) and combinations thereof. The height of the nanofeatures can be selected to achieve a desired aspect ratio (ratio of height to diameter), ranging from, for example, 1 to 20 or more, such as 1, 2, 3, 4, 5, or 10. The maximal achievable aspect ratio from a practical standpoint depends at least in part upon whether the nanofeatures in the respective precursor layers are sufficiently self-supporting after the mold is removed. In some embodiments, it may be challenging to completely fill nano-concavities having a high aspect ratio with the polymer due to factors such as solvent pressure and/or difficulty displacing air within the nano-concavities. In certain embodiments, the maximal achievable aspect ratio is increased when low pressure is applied during the molding process to facilitate filling nano-concavities in the mold with the polymer. Generally, rod-shaped or pillar-shaped nanofeatures exhibit good self-support and can be formed at high aspect ratios. Thus in some embodiments, the nano-concavities in the mold have an average diameter of ≤200 nm, such as ≤150 nm, ≤100 nm, ≤80 nm, ≤60 nm, ≤50 nm, ≤30 nm, 20-150 nm, 30-125 nm, 30-50 nm, 50-100 nm, 50-80 nm, or 70-80 nm, and an average depth of 50-500 nm, such as 50-100 nm, 75-125 nm, 100-150 nm, 100-200 nm, 150-300 nm, 200-400 nm, or 250-350 nm. The pitch of the nano-concavities on the mold is not limiting, and a practical pitch usually can be achieved without difficulty. In some embodiments, the center-to-center pitch of the nano-concavities is 1.1-2× the average diameter of the nano-concavities, such as 1.1-1.6× the average diameter, or 1.2-1.5× the average diameter. For example, when the nano-concavities have an average diameter of 100 nm, the center-to-center pitch may be 110-200 nm, such as 110-160 nm or 120-150 nm, providing a distance between adjacent nanofeatures of 10-100 nm.

B. Forming a Nanostructured Polymer Layer

In some embodiments, the mold and polymer are brought together by applying, depositing, or forming the polymer material as a film, thin layer, or other unit, on the surface of a substrate, followed by application of the mold to the polymer. The polymer material may be a molten polymer or a solution comprising a polymer and a solvent. In this way, the polymer material can be formed into a film before or as a result of application of the mold to the material. Pre-forming a polymer film on the substrate surface can be achieved by, e.g., spin-coating or blade-coating or simply placing a drop of the solution on the surface of the substrate. The mold is pressed into the polymer material to form the nanofeatures and subsequently removed. Desirably, sufficient polymer material is applied to the substrate so that the polymer material substantially fills the mold when the mold is pressed into the polymer material. In some embodiments, the substrate and polymer material are heated to soften or melt the polymer material such that the mold can be pressed into the polymer material, thereby forming the nanofeatures. In certain embodiments, the mold also may be heated to facilitate forming the nanofeatures.

In some embodiments, as illustrated in FIG. 1, a polymer material 100 is applied to the nanopatterned surface of the mold 110. The polymer material 100 may be a molten polymer or a solution comprising a polymer and a solvent. Effective techniques for applying the polymer material to the mold surface include 1) pouring or dispensing a polymer solution 100 into the mold 110, and 2) spin-coating, blade-casting, and/or dip-coating a polymer 100 material (e.g., a molten polymer) into the mold 110. Desirably a technique is selected that will achieve full penetration or substantially full penetration of the polymer or polymer solution into the nano-concavities 115 in the mold 110. After filling the mold 110 with the polymer, the polymer may be cooled to increase its viscosity and/or at least partially solidify the polymer and produce a nanostructured polymer 120. If a polymeric solution is used, the mold 100 and polymeric solution may be heated to increase the solution's viscosity and/or evaporate at least a portion of the solvent and produce nanostructured polymer 120. Nanostructured polymer 120 then can be transferred from the mold 110 to the surface of a suitable substrate 130. This transfer can be achieved simply by direct contact of an unpatterned surface 125 of the polymer 120, while on the mold 110, to the substrate surface 130. In some embodiments, the substrate surface 130 first is coated with a thin layer 140 of the polymer to facilitate transfer of nanoarchitectured polymer 120 from mold 110 to substrate 130 in the absence of adhesives. Mold 110 then is removed from nanostructured polymer 120, leaving the nanostructured polymer 120 on the substrate surface 130.

In any of the above embodiments, either before or after removing the mold(s) from the polymer, a condition may be applied (e.g., a thermal condition and/or a radiative condition, suitable for gelling, partial polymerizing, partial cross-linking, partial cyclizing, stabilizing, or the like, of the polymer) to stabilize or cure the polymer sufficiently to preserve the integrity of the nanofeatures formed. In general, this application of the conditions and its result are termed "stabilization." In some embodiments, stabilization is performed after removing the mold. In certain embodiments, stabilization involves heating the polymer (e.g., at a temperature of 100-350° C.) for a defined time period (e.g., 1-5 hours). The selected temperature is a temperature below that which would carbonize or otherwise decompose the polymer. If the polymer is applied to the mold as a solution, stabilization also typically results in driving off any significant remaining solvent left in the nanoarchitectured polymer. In some embodiments, the nanoarchitectured polymer is subsequently removed from the substrate and utilized as a free-standing polymer structure. In other embodiments, the nanoarchitectured polymer remains on the substrate for further use.

Removing the mold leaves the desired profile of nanofeatures on the polymer surface. The nanofeatures can be, for example, configured as rods or pillars, corresponding to a desired architecture, size, and placement. The nanofeatures can be in an ordered array or arrays as desired, or a deliberately random array. The nanofeatures need not all be the same size, shape, or ordered the same way over the entire surface. Also, the nanofeatures need not be present over the entire surface.

There is no limit on the size and shape of the nanoarchitectured polymer. From one practical standpoint, the size and shape are dictated, at least in part, on the size and shape of the mold used. However, the entire polymer unit need not be molded at the same time. In one embodiment, a large-area nanostructured polymer layer may be prepared by pressing the mold into a portion of a polymer layer on a substrate, and then transferring the mold to a different region of the polymer layer and repeating the process. However, this method may not be feasible if the polymer is heated to above its glass-transition temperature to facilitate imprinting since the heating process may at least partially melt and/or destroy nanostructures formed on previously imprinted regions of the polymer layer.

In another embodiment, a large-area nanostructured polymer layer is prepared as shown in FIG. 1 by filling the mold with polymer (or a polymer solution) to form a nanostructured polymer, transferring the nanostructured polymer in the mold to a region of the substrate. The process is repeated by moving the filled mold each time to a different region of the substrate. In contrast, conventional methods of nanoimprinting typically are not suitable for preparing nanostructured polymers that are larger than the mold due to the disadvantages inherent in reheating the substrate with the partially nanostructured polymer layer so that adjacent regions of the polymer layer can be imprinted. Thus, embodiments of the disclosed method facilitate preparation of a large-area nanostructured polymer that may be many times larger than the mold. For example, a 3 cm×6 cm nanostructured polymer layer can be formed manually on a substrate using a 1 cm$^2$ mold in less than 30 minutes. Embodiments are also contemplated in which supplying the substrate, applying the polymer, bringing the mold(s) and polymer together, and applying any stabilizing conditions are coordinated and automated for continuous or semi-continuous production. An automated process is much faster than manual molding, and may be used to make nanostructured polymer layers having lengths and widths that are measured in meters, e.g., 1-10 meters or even larger depending upon the machine's capacity.

In some embodiments, nanoarchitectured polymers ("nanoarchitectured polymer scaffolds") are produced on a commercial scale using the methods disclosed herein. In certain embodiments, a large-area nanoarchitectured polymer scaffold (e.g., a nanostructured polymer layer) is formed and subsequently cleaved into a plurality of smaller nanoarchitectured polymer scaffolds. In one embodiment, the polymer scaffold and substrate both are cleaved. In another embodiment, the nanoarchitectured polymer scaffold is removed from the substrate prior to cleavage into smaller nanoarchitectured polymer scaffolds. In one embodiment, the nanoarchitectured polymer scaffold is removed from the substrate and transferred to another substrate for subsequent use in a device such as a photovoltaic cell, light-emitting diode, or field-effect transistor.

Suitable polymers include thermoset polymers and polymers that are soluble in one or more solvents. Suitable polymers also may be selected based at least in part upon the device in which the nanostructured polymer will be used. In some embodiments, the device is a photovoltaic cell and the polymer is a photovoltaically active polymer, e.g., a polymer capable of charge generation. Suitable active polymers include, but are not limited to, poly(3-hexylthiophene-2,5-diyl) (P3HT) and poly(3-dodecylthiophene-2,5-diyl) (P3DT). In some embodiments, the device is a photovoltaic cell, such as a solar cell, and the polymer is an inert polymer that is substantially optically transparent over a desired wavelength range, e.g., at least a portion of the wavelength range corresponding to visible light. Suitable inert polymers include, but are not limited to, polyacrylontrile (PAN), amorphous poly(carbonate) (APC) and polymethylmethacrylate (PMMA).

In certain embodiments, the polymer is PAN. PAN can be obtained in a relatively low-crosslinked form that can be fluidized by, for example, dissolution in a suitable solvent for nanomolding. An exemplary solvent for PAN is dimethylformamide. In some embodiments, a PAN solution has a concentration of 1-40 wt % PAN, such as 1-30 wt %, 5-30 wt %, 10-40 wt %, 20-40 wt %, or 25-35 wt %. PAN can be nanomolded by applying (e.g., by spin-coating or blade-casting) a layer of this solution onto the surface of the mold and subsequently heating the solution to partially cyclize the PAN molecules. Cyclization increases the viscosity of the solution, thereby stabilizing the formed nanofeatures. Heating also removes at least a portion of the solvent, further increasing the viscosity. In some embodiments, the solution is heated to a temperature of 140-250° C. for 1-5 hours. The selected temperature and time may depend at least in part on the concentration of the PAN solution. The resulting nanomolded layer is transferred to a substrate. In certain embodiments, the substrate is coated with a thin layer of PAN to facilitate transfer of the molded layer from the mold to the substrate. The anti-wetting behavior of PAN on the nanostructured mold also facilitates transfer of the molded layer from the mold to the substrate. Because the method typically is performed with no applied pressure, the mold is re-usable and can be used to make hundreds of structures without defect, thereby making the process cost-effective compared to other techniques.

Embodiments of the disclosed methods clearly differ from conventional nanoimprinting lithography (NIL) techniques in which nanostructuring is done by pressing a template at high temperature and pressure onto a resist deposited on a substrate. In the NIL process, high temperature and pressure, or UV light, are necessary to produce nanostructures. In embodiments of the disclosed methods, nanomolding can be performed without using any of the above conditions.

C. Device Construction

In some embodiments, the first step in making a nanopatterned device is to form a nanostructured polymer layer on a substrate using a nanopatterned mold as described above. The nanostructured polymer layer includes a plurality of nanofeatures. In some embodiments, the nanofeatures are nanopillars having an average diameter of ≤200 nm, such as ≤150 nm, ≤100 nm, ≤80 nm, ≤60 nm, ≤50 nm, ≤30 nm, 20-150 nm, 30-125 nm, 30-50 nm, 50-100 nm, 50-80 nm, or 70-80 nm, and an average height of 50-500 nm, such as 50-100 nm, 75-125 nm, 100-150 nm, 100-200 nm, 150-300 nm, 200-400 nm, or 250-350 nm. In certain embodiments, the nanofeatures have a center-to-center pitch of 1.1-2×, 1.1-1.6×, or 1.2-1.5× the average diameter of the nanofeatures. In particular embodiments, e.g., solar cells, it is advantageous to have a distance, or separation, between nanofeatures of 10-120 nm, such as 10-100 nm, 10-80 nm, 10-50 nm, or 10-20 nm, as discussed below.

In some embodiments, an electrode material is deposited onto the nanostructured polymer layer. The electrode material may be deposited by any suitable method, e.g., vacuum deposition, vapor deposition, or sputtering. Sufficient electrode material is deposited to form an electrode coating on the nanostructured polymer layer while maintaining a nanoarchitectured structure. In some embodiments, the coating has an average thickness of 10-110 nm, such as 10-100 nm, 10-75 nm, 10-50 nm, 10-40 nm, 15-30 nm, 15-20 nm, or 20-25 nm. In some embodiments, the coating is a conformal coating. In other embodiments, it is non-conformal and the coating is thicker at the top and base of the nanofeatures (e.g., nanopillars) than on the side walls of the nanofeatures. Coating the nanostructured polymer layer with an electrode coating produces a nanostructured electrode (NSE). Deposition of metal and metal oxides generates a core—shell type geometry of the electrodes with the polymer layer forming the core and the electrode coating forming the shell. With such a geometry, the total quantity of material required to fabricate NSEs is significantly less than a "core only" NSE with equivalent surface area.

In certain embodiments, additional materials are deposited onto the nanostructured electrode. In one embodiment, one or more additional layers, e.g., a semiconductor material or an organic material, may be deposited as one or more thin films on the electrode, thereby forming one or more additional nanostructured layers. In another embodiment, an additional material is deposited in sufficient quantity to substantially fill spaces between the nanofeatures (e.g., nanopillars) of an underlying nanostructured layer and to produce a layer of material over the nanofeatures, thereby producing a substantially planar top surface on the device. If desired, one or more additional layers, e.g., a second electrode layer, may be deposited onto the planar top surface.

Figure 2:
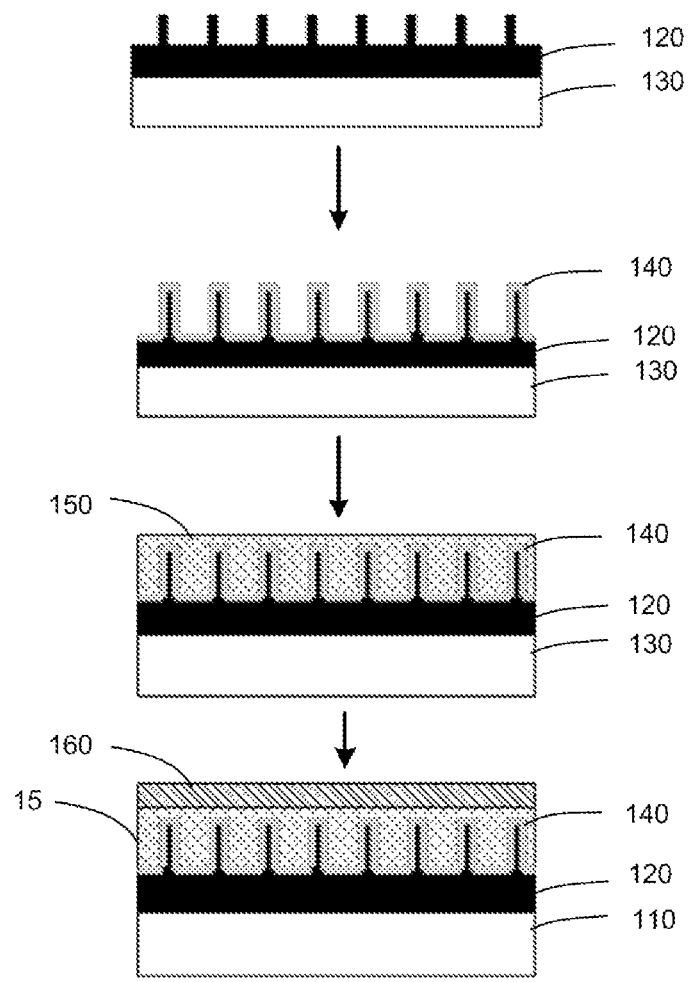
FIG. 2 is a schematic diagram illustrating one embodiment of a method for making a nanopatterned device.

FIG. 2 illustrates one embodiment of the disclosed method for making a nanopatterned device. A substrate 130 having a nanostructured polymer 120 on a first surface of substrate 130 is provided. The nanostructured polymer is prepared by an embodiment of the methods described herein (see, e.g., FIG. 1). An electrode material is deposited onto nanostructured polymer layer 120 to produce an electrode coating 140. Another material 150 (e.g., a bulk heterojunction organic material or a semiconductor material) is deposited in sufficient quantity to fill spaces between the nanofeatures and produce a layer of material over the nanofeatures. In some embodiments, the layer of organic material has a thickness of 20-200 nm, such as 20-150 nm, 20-100 nm, 20-50 nm, 50-100 nm, or 50-150 nm over the nanofeatures. A second electrode layer 160 then is deposited onto organic material 150. In some embodiments, one or more additional materials may be deposited as coatings (not shown) onto electrode coating 140 before depositing material 150.

In one embodiment, an organic solar cell is made by (1) fabricating nanostructures on a transparent polymer surface deposited on a glass plate as disclosed herein, (2) depositing a first electrode material on top of the nanostructured polymer surface to form a nanostructured electrode, (3) depositing a bulk heterojunction organic material that substantially fills spaces between nanofeatures of the nano structured electrode and forms a layer on top of the nanofeatures, and (4) depositing a second electrode material layer on top of the bulk heterojunction organic material. One of the first electrode material and the second electrode material is an electron collector material (e.g., a metal such as aluminum), and the other of the first electrode material and the second electrode material is a hole collector material (e.g., silver, indium-tin-oxide, or indium-zinc-oxide).

In another embodiment, an organic solar cell is made by (1) fabricating nanostructures on a transparent polymer surface deposited on a glass plate as disclosed herein, (2) depositing a first electrode material on top of the nanostructured polymer surface to form a nanostructured electrode, (3) depositing a first organic material (a donor material or acceptor material) onto the nanostructured electrode to form a nanostructured first organic layer, (4) depositing a second organic material (with the opposite characteristic) that substantially fills spaces between nanofeatures of the first organic layer and forms a layer on top of the nanofeatures, and (5) depositing a second electrode material layer on top of the second organic material.

In one embodiment, an inorganic-organic hybrid photovoltaic cell is made by (1) fabricating nanostructures on a transparent polymer surface deposited on a glass plate as disclosed herein, (2) depositing an electron collector electrode (cathode) on top of the nanostructured polymer layer to form a nanostructured electrode, (3) depositing an inorganic semiconductor (e.g., silicon (Si) or cadmium selenide (CdSe)) by vapor deposition (Si) or spin casting (CdSe) to form a nanostructured inorganic semiconductor layer, (4) depositing an active polymer layer over the inorganic semiconductor layer that substantially fills spaces between nanofeatures of the inorganic semiconductor layer and forms a layer on top of the nanofeatures, and (5) vapor depositing an anode (e.g., ITO) on top of the active polymer layer.

In one embodiment, an inorganic nanocrystal-based photovoltaic cell is made by (1) fabricating a nanostructured polymer on a glass plate as disclosed herein, (2) depositing an anode material (e.g., ITO) on top of the nanostructures to form a nanostructured anode, (3) producing a uniform film of a first inorganic semiconducting material (e.g., CdTe) on the anode by spin casting to form a nanostructured first inorganic semiconductor layer, (4) evaporating the solvent from the first inorganic semiconducting material, e.g., by annealing it (e.g., by heating CdTe to 200° C.), (5) depositing, such as by spin-coating, a layer of a second inorganic semiconducting material (e.g., CdSe) over the first inorganic semiconductor layer that substantially fills spaces between nanofeatures of the first inorganic semiconductor layer and forms a layer on top of the nanofeatures, and (6) thermally depositing a cathode material (e.g., aluminum) on top of the second inorganic semiconducting material.

In one embodiment, an inorganic solar cell is made by (1) fabricating a nanostructured polymer on a glass plate as disclosed herein, (2) depositing a cathode material (e.g., aluminum) on top of the nanostructures to form a nanostructured back contact electrode, and (3) depositing other layers as desired to form an inorganic solar cell.

In one embodiment a light-emitting diode (LED) or organic light-emitting diode (OLED) is made by (1) fabricating a nanostructured transparent polymer on a glass plate as disclosed herein, (2) depositing an anode material (e.g., ITO) on top of the nanostructured polymer layer to form a nanostructured anode, and (3) depositing other layers sequentially on top of the nanostructured anode.

In any of the above embodiments, a hole-blocking layer may be placed between the electron collector electrode (cathode) and an active layer (e.g., a bulk heterojunction organic material, a donor material, an acceptor material, inorganic semiconducting material, or an active polymer). In certain embodiments, the hole-blocking layer comprises LiF/TiO$_x$. In any of the above embodiments, a layer of poly(3,4-ethylenedioxythio-phene)/poly(styrene sulfonate) (PEDOT:PSS) may be deposited on top of the hole collector electrode (anode) for contact improvement and better hole mobility. In certain embodiments, a layer of NiO$_x$ is utilized in place of PEDOT:PSS or is placed between the hole collector electrode and the PEDOT:PSS layer.

III. Nanopatterned Devices

Disclosed nanopatterned devices include at least one nanostructured polymer layer formed by the embodiments of the methods disclosed herein. Embodiments of nanopatterned devices include nanostructured electrodes suitable for use in photovoltaic cells (e.g., organic solar cells, inorganic-organic hybrid solar cells, nanocrystal solar cells), light-emitting diodes, and field-effect transistors. In these electron donor-acceptor devices, the processes of charge (hole/electron) injection, charge transport, charge recombination (exciton formation), charge separation (exciton diffusion and dissociation), and/or charge collection are variables affecting device performance. The optical and electronic properties of these devices are closely correlated to the nanostructure dimensions and can be tuned by changing feature sizes.

A. Organic Solar Cells

Meeting the present and future energy demand in an environmentally friendly manner is one of the most important challenges facing humankind today. Fossil fuels, which supply more than 80% of the present energy demand, result in greenhouse gases which contribute enormously to the global warming. Photovoltaic (PV) cells are considered to be the best viable alternative to fossil fuels because the energy is renewable, quiet, and free of pollutants. However, wafer-based crystalline silicon PV cell generated energy is more costly than energy generated from conventional methods. One way to reduce the cost is to increase the power conversion efficiency (PCE) and reduce the production cost.

The disclosed organic and organic-inorganic hybrid PV cells reduce the production cost of solar energy since they can be formed from solution or vapor phase at lower temperatures than silicon wafers, and are easily scaled up to produce larger cells. However, the PCE of currently available organic/hybrid PV cells is lower than 7% (compared to 12% or more for inorganic PV cells), causing economic infeasibility for commercial implementation. Embodiments of the disclosed organic/hybrid PV cells offer advantages over their inorganic counterparts due to their flexible nature and lighter weight. These characteristics are particularly important for future applications of generating electricity by installing organic/hybrid PV cells on roof tops of the buildings and motor vehicles. The target PCE for commercially viable organic PV cells is greater than or equal to 10%.

A conventional organic solar cell includes a thin layer of a hole-collecting electrode (e.g., indium tin oxide (ITO) or silver) deposited on a glass substrate. A layer of poly(3,4-ethylenedioxythio-phene)/poly(styrene sulfonate) (PEDOT:PSS) is deposited on top of this electrode for contact improvement and better hole mobility (~20 nm thick). The active layer, which is a charge generating component like polythiophene-fullerene (a bulk heterojunction material including both electron donor and electron acceptor materials), is deposited by spin casting. In a multilayer heterojunction solar cell, two separate layers for the hole and electron generation are deposited. The electron collector electrode is deposited on top of this layer.

With reference to FIG. 2, some embodiments of organic solar cells prepared by the methods disclosed herein comprise a substrate 130 having a nanostructured polymer layer 120 thereon. An electrode coating 140 comprising a first electrode material is disposed on nanostructured polymer layer 120. In one embodiment, the first electrode material is an anode, or hole collector, material such as indium tin oxide, indium zinc oxide, or silver. In another embodiment, the first electrode material is a cathode, or electron collector, material such as a metal, e.g., aluminum.

In one embodiment, an organic solar cell further comprises a bulk heterojunction organic material 150. The bulk heterojunction organic material includes both electron donor and electron acceptor materials. Suitable bulk heterojunction materials include a mixture of highly regioregular poly(hexylthiophene) and substituted fullerenes (PCBM). The bulk heterojunction organic material substantially fills spaces between nanofeatures and provides a layer of organic material over the nanofeatures, thereby forming a substantially planar surface. In another embodiment, an organic solar cell further comprises a multilayer heterojunction material configuration. In a multilayer heterojunction material configuration, the organic solar cell comprises a first material coating (either a donor material or an acceptor material) deposited onto electrode coating 140, and a second material 150 that substantially fill spaces between nanofeatures and provides a layer of organic material over the nanofeatures. In one embodiment, the first material is a donor material, and the second material is an acceptor material. In another embodiment, the first material is an acceptor material, and the second material is a donor material. Suitable donor materials include, but are not limited to, phthalocyanine, oligoacenes, and poly (3-hexylthiophene)s. Suitable acceptor materials include fullerene derivatives like PCBM or any other energetically favorable molecules.

Figure 3:
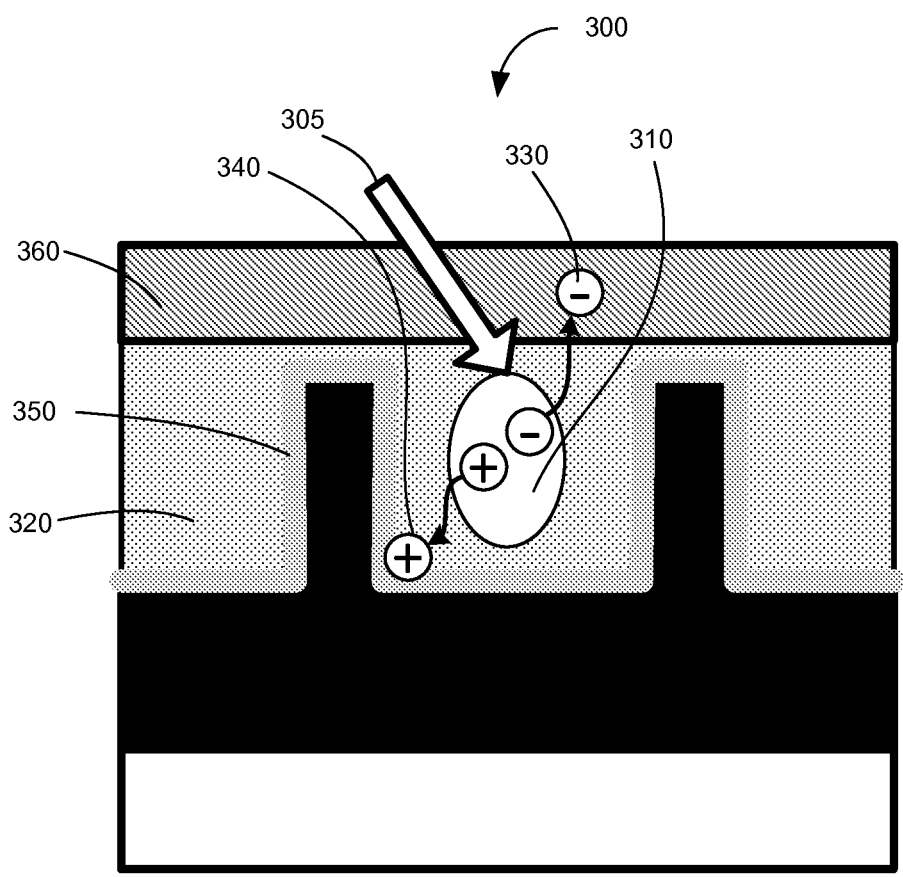
FIG. 3 is a schematic diagram illustrating the function of an organic solar cell made by one embodiment of the disclosed methods.

With reference to FIG. 3, harvesting solar energy 305 in an organic PV cell 300 involves (i) photogeneration of excitons 310, (ii) exciton 310 diffusion to the donor-acceptor heterojunction material 320, (iii) exciton dissociation into electrons 330 and holes 340, (iv) charge transport to the electrodes 350, 360 and (v) charge collection at the electrodes 350, 360. The exciton diffusion length ($L_D$) is the distance an exciton can diffuse before the geminate recombination of electrons and holes. In conjugated organic materials and polymers, $L_D$ varies from 6-300 nm, such as from 6-200 nm, 6-100 nm, 6-80 nm, 6-50 nm, 6-20 nm, 6-15 nm, 6-10 nm, 10-50 nm, 10-20 nm, or 10-15 nm. Hence an important step towards improving the PCE is separating the charges within the $L_D$ and allowing the separated charges to migrate to the electrodes before electron and hole recombine, while also maintaining a thick enough film to allow most of the incident light to be absorbed. Embodiments of the disclosed nanostructured electrodes and solar cells play a crucial role at this PCE rate-determining step.

Impurities, interfaces, and difference in electron affinities and ionization potential between a donor material (e.g., phthalocyanine, oligoacenes, poly(3-hexylthiophene)) and an acceptor material (e.g., a fullerene derivative like PCBM for organic solar cells or inorganic nano-rods in the case of hybrid solar cells) are efficient sources of charge separation. With intrinsically short exciton diffusion length of 6 nm to 100 nm in organic materials, embodiments of nanopatterned organic solar cells comprise nanofeatures (e.g., nanopillars) having a distance between nanofeatures within this range to facilitate an efficient dissociation of excitons into electrons and holes. Ideally excitons will only have to diffuse a relatively short distance before reaching a donor/acceptor interface.

Figure 4:
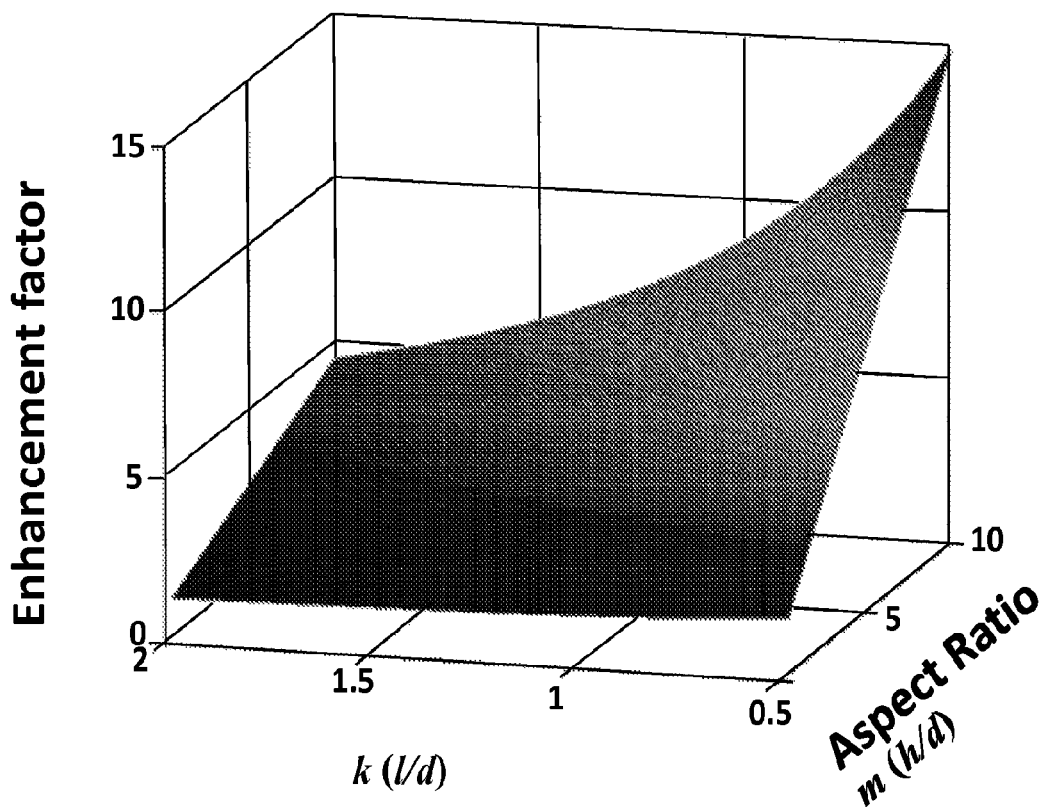
FIG. 4 is a graph illustrating the effects of nanofeature height, diameter, and separation distance on surface area.

Advantages of using nanostructured electrodes can be understood by examining the formal expression for the composite PCE ($\eta_E$) of a solar cell:

$$\eta_E = \eta_a \eta_d \eta_c$$

where $\eta_a$ is the photon absorption efficiency (PAE), $\eta_d$ the exciton dissociation efficiency (EDE), and $\eta_c$ the charge collection efficiency (CCE). Geometric calculations revealed that a 100-nm diameter pillar nanostructure with 100-nm height and 120-nm pitch can increase surface area about 2-3 times compared to a non-patterned surface. FIG. 4 is a graph illustrating the surface area effects of nanofeature height, diameter, and separation distance. Nanopillar electrodes having an aspect ratio of 3 to 4 can increase surface area up to 10- to 17-fold compared to a planar surface. When a polymeric active layer fills the space between the nanopillar electrodes, the polymeric active layer also becomes nanostructured. The nanostructuring provides 3- to 4-fold enhancement in the volume of active material in the nanostructured device compared to a conventional device with a planar active layer. Hence the effective volume for carrier generation is also increased, which enhances the PAE. Nanopillar electrode structures having a separation distance within the $L_D$ enhance EDE. Moreover, the presence of the electrodes in close proximity to the dissociated charges greatly accelerates separation of the charges before recombination, resulting in enhanced CCE. In combination, these component efficiencies substantially enhance overall PCE. In one embodiment, a nanostructured organic solar cell comprises a nanoarchitectured polymer layer having an individual pillar diameter of 40 nm with a pitch of 50 nm and a height of 80 nm.

B. Inorganic-Organic Hybrid Photovoltaic Cells

The narrow absorption band at AM1.5 and low electron mobilities of organic materials limit the quantum efficiency of the organic solar cells to less than 6%. In order to achieve higher conversion efficiency, the disclosed hybrid photovoltaic cells are constructed using semiconducting polymer and nanostructured inorganic semiconducting materials. The semiconducting polymer is selected to provide electronic compatibility with the inorganic semiconductors used. For example, polythiophene is a suitable polymer for use with CdSe. One embodiment of an inorganic-organic hybrid cell 500 shown in FIG. 5. Cell 500 comprises a substrate 510, a nanostructured inert polymer layer 520, an electron collector electrode 530 (cathode) on top of polymer layer 520, an inorganic semiconductor 540, a semiconducting (active) polymer 550, and a hole collector electrode 560 (anode). In some embodiments, inorganic semiconductor 540 (e.g., silicon (Si) or cadmium selenide (CdSe)) is deposited by vapor deposition (Si) or spin casting (CdSe), thereby forming a nanostructured inorganic semiconductor. The active polymer layer 550 is deposited over the inorganic semiconductor layer 540 in sufficient quantity to substantially fill spaces between the nanofeatures of nanostructured inorganic semiconductor 540. The anode 560 (e.g., ITO) is deposited by any suitable means such as vapor deposition, vacuum deposition, or sputtering.

The nanostructured design (i) provides large area interfaces to facilitate greater exciton dissociation, and (ii) facilitates greater electron mobilities that significantly increase electron collection and at the same time rapidly reduce the concentrations of electrons near the electron donor and electron acceptor interfaces, which lowers the incidence of electron-hole recombination.

Some embodiments of hybrid inorganic-organic solar cells have a wider absorption spectrum than organic solar cells, thereby creating more electrons and holes. Embodiments of hybrid inorganic-organic solar cells also provide "pathways" for rapid transport of electrons and holes to the respective collecting electrodes. In this embodiment, holes move through an organic medium, whereas electrons move in a highly ordered nano-structured inorganic semiconductor medium. Embodiments of the nanopatterned hybrid inorganic-organic solar cells also provide a sufficient separation between the electron and the hole upon exciton dissociation to minimize their recombination probability. This problem has been difficult to solve with blends of active materials (i.e. heterojunction solar cells) or in a multilayer approach using two or more organic material layers. The use of the disclosed structured inorganic materials with significantly higher electron mobilities increases the cell efficiency. The organic medium has a modest but usable hole mobility. The organic medium also is easier to tune (i.e., vary its composition) than an inorganic medium with regard to its absorption of the incident solar spectra.

C. Inorganic Nanocrystal-Based Solar Cells

Embodiments of solar cells made by the disclosed methods comprising colloidal inorganic nanocrystals offer advantages similar to organic solar cells such as solution processing and broadband absorption. Moreover, inorganic nanocrystal-based solar cells have an added advantage of superior charge transport. The solution processed nanocrystal based solar cells depend on the donor-acceptor (D-A) concept used in organic solar cells. Efficient charge transfer can occur between type II semiconductor nanocrystals having a heterostructure with staggered energy levels.

Figure 5:
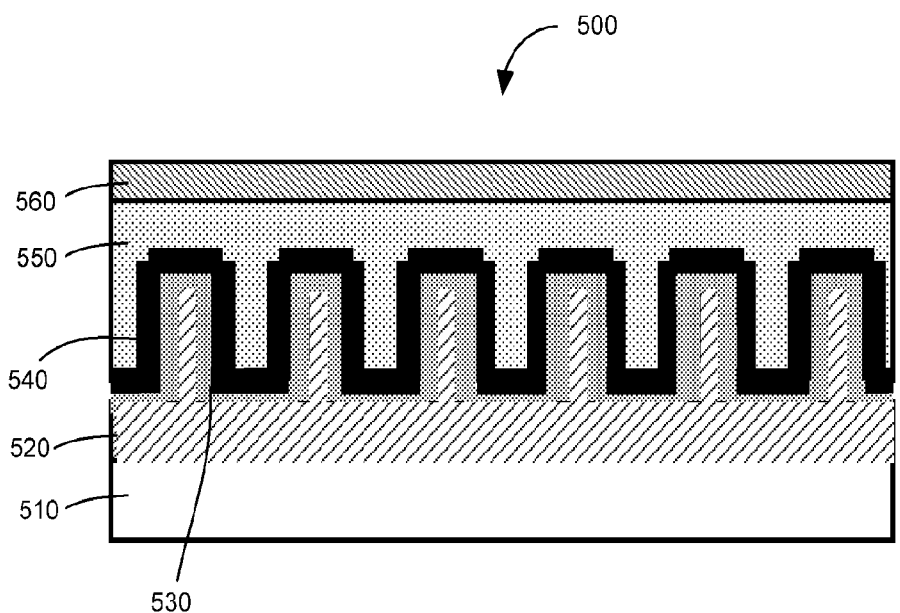
FIG. 5 is a schematic diagram illustrating the structure of an inorganic-organic hybrid solar cell or an inorganic nanocrystal-based photovoltaic cell made by one embodiment of the disclosed methods.

Some embodiments of inorganic nanocrystal-based photovoltaic cells have a similar structure to the inorganic-organic hybrid solar cell illustrated in FIG. 5. With reference to FIG. 5, one embodiment of an inorganic nanocrystal-based photovoltaic cell 500 comprises a nanostructured polymer layer 520 on a substrate 510 (e.g., a glass plate). An anode 530 (e.g., ITO) is disposed on the nanostructured polymer layer, providing a nanostructured anode. A first inorganic semiconducting material 540 (e.g., CdTe) is coated onto the nanostructured anode 530. A second inorganic semiconducting material 550 (e.g., CdSe) substantially fills the spaces between nanofeatures and forms a layer on top of the nanofeatures, thereby producing a substantially planar surface on which a cathode material 560 is deposited. Like in organic solar cells, the nanostructured electrodes can highly enhance the charge collection efficiency as well as the exciton dissociation efficiency. Hence a nanostructured solar cell made from nanocrystals has the potential to enhance the power conversion efficiency of these solar cells.

D. Light-Emitting Diodes and Organic Light-Emitting Diodes

Embodiments of nanostructured electrodes made by the disclosed methods may be useful for the production of LEDs and OLEDs. At present the light extraction efficiency from OLEDs is limited to about 20% because most of the light emitted is confined within the device itself due to total internal reflection from different layers of the device structure. There is also light loss from the glass-air interface. These losses result from the mismatch in the refractive indices between the different layers. To improve the efficiency, the loss from the different internal layers (~40%) and the glass-air interface (~40%) should be minimized. A potential solution is to use a nanopatterned photonic crystal structure which can work as a light deflector.

In some embodiments, an LED or OLED comprises a nanostructured polymer layer on a substrate (e.g., a glass plate), an anode material (e.g., ITO) coating over the nanostructured polymer layer, thereby forming a nanostructured anode, and additional layers sequentially deposited onto the nanostructured anode. Because the polymer layer is nanopatterned, all overlying layer also are patterned accordingly. This nanopatterning, or nanostructuring, reduces light losses within the LED (or OLED), thereby increasing light extraction efficiency.

IV. Examples

Example 1

Silver Nanostructured Electrodes Prepared on Nanostructured Amorphous Poly(Carbonate)

Figure 6:
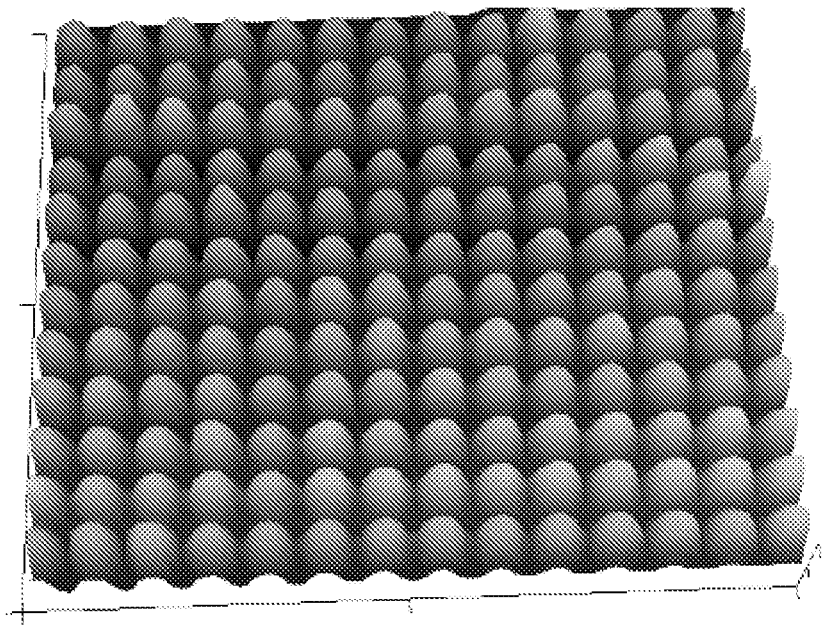
FIG. 6 is an atomic force microscopy (AFM) image of a nanostructured polymer layer formed by one embodiment of the disclosed methods.

A silicon wafer mold having an array of nanoholes (diameter 400 nm) was used as a mold to imprint structures on a high-temperature melting amorphous poly(carbonate) (APC) polymer on a glass substrate using a hot plate under an applied pressure of 25 Kg/cm$^2$). Studies showed that the Si mold could be used several hundred times without any deterioration in the nature/quality of the imprinted nanostructure. FIG. 6 is an atomic force microscope image of ~400-nm diameter nanopillars formed on an APC polymer layer.

Figure 7:
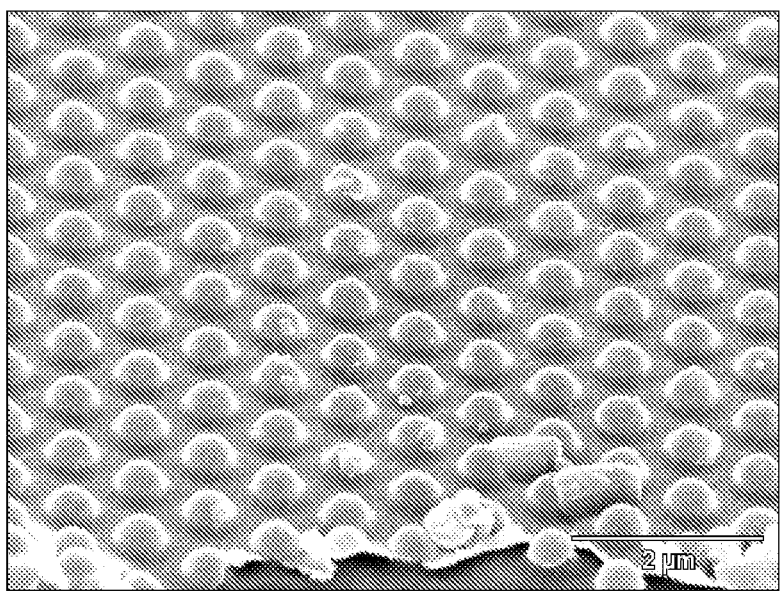
FIG. 7 is a scanning electron microscope (SEM) image of a nanostructured silver electrode formed by one embodiment of the disclosed methods.

Nanostructured electrodes were produced by depositing a silver (Ag) film of 15-20 nm thickness on these nanoimprinted replicas by evaporation techniques (FIG. 7). This example demonstrated that a one-time investment of time and money produced a mold that could be used in the production of several hundreds of replicas on polymer films, leading to the production of hundreds of metal-deposited electrodes.

Example 2

Figures 8A, 8B, 8C:
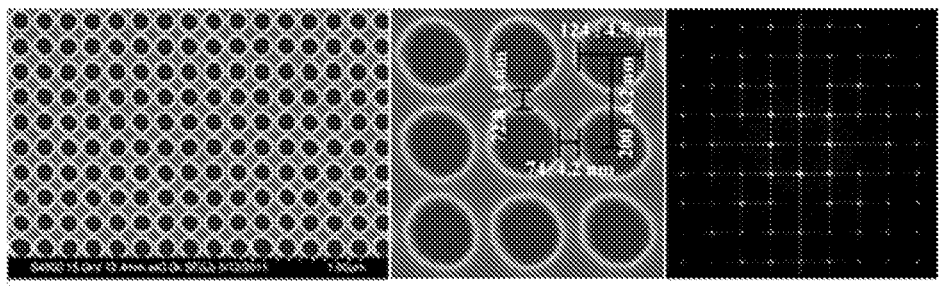
FIGS. 8A-8C are SEM micrographs (8A-8B) and a Fast Fourier Transform image (8C) of a nanopatterned mold for use with embodiments of the disclosed methods.

Indium Zinc Oxide, Indium Tin Oxide, and Silver Nanostructured Electrodes Prepared on Nanostructured Polyacrylonitrile Two master molds (SiC on Si) then were fabricated, one containing holes of 100±4 nm in diameter, 400 nm in depth and a 200±8.4 nm center to center spacing, and the other with holes of 124±4.5 nm in diameter, 400 nm in depth and a 200±6.2 nm center to center spacing were prepared using conventional e-beam lithography. These molds were commercially obtained from Nanofabrication Facility at UCSB. All chemicals and materials were obtained commercially and were used as purchased without further purification. The size parameters measured over 5 frames of 50 μm×50 μm in SEM micrographs showed very good uniformity and low dispersion (FIGS. 8A-8B). Fast Fourier Transform (FFT) of the mold image clearly shows a high degree of ordering with a perfectly square lattice (FIG. 8C). Because the source image dimension is not an integer times the lattice constant, some horizontal and vertical streaking is observed within the FFT image.

The master molds were used to fabricate polyacrylonitrile (PAN) nanostructures. A 30 wt % of PAN solution in dimethylformamide (DMF) was prepared. This solution was heated at 150° C. for 2 hours under constant stirring to partially cyclize PAN. The partially cyclized PAN was spun-coated onto the master mold. The solvent was evaporated, and the resulting PAN film was transferred to the substrate at room temperature. The transferred PAN film had a nanostructured pattern inverse to that of the master mold.

Figures 9A, 9B, 9C:
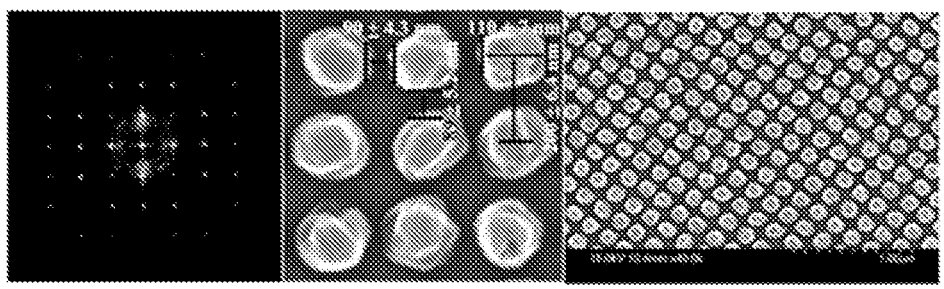
FIGS. 9A-9C are a Fast Fourier Transform image (9A) and SEM micrographs (9B-9C) of polyacrylonitrile nanopillars formed by one embodiment of the disclosed methods using the nanopatterned mold of FIGS. 8A-8C.

Solvent removal and curing of PAN shrunk the nanopillars by up to 15 nm in diameter and resulted in visibly deformed shapes. An FFT image (FIG. 9A) of an SEM micrograph of the PAN nanopillars shows frequency noise around the spots due to this deformation and somewhat larger dispersion. As shown in the SEM micrographs (FIGS. 9B-9C), the height of the PAN nanopillars was 300-310 nm.

Nanostructured electrodes (NSEs) were formed by coating the PAN nanopillars with various metals or metal oxides. For ITO deposition, RF sputtering and a target $In_2O_3$—$SnO_2$ of were used. The tin concentration was 10%. The deposition rate is dependent on sputter power and oxygen pressure. In this example, the rate was 0.5 Å/s. In all cases, the substrate was kept at room temperature. X-ray diffraction showed that the final film was amorphous. The current and voltage were 40 mA and 1200V respectively. For silver deposition, DC sputtering and pure silver as the target were used. The rate of deposition was 1.7 Å/s. The pressure was about $10^{-7}$ torr prior to deposition, but during deposition it increased to $6 \times 10^{-3}$. Argon was injected into the chamber at a flow rate of 0.05 ml/min. The sputter power was 170 W. Silver has much smaller grain size compared to ITO, and a more uniform coating was obtained. Coating thickness was measured with a Sopra GES5E ellipsometer.

Figure 10A:
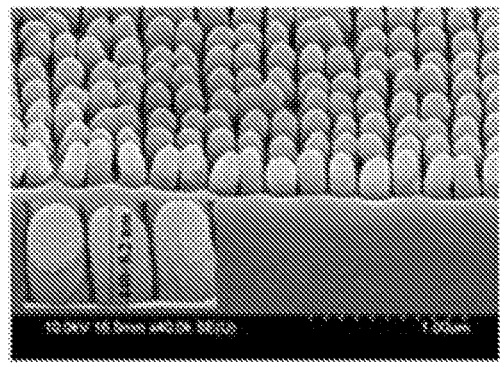
FIGS. 10A-10C are SEM micrographs of nanostructured electrodes made by one embodiment of the disclosed methods.
Figures 10B, 10C:
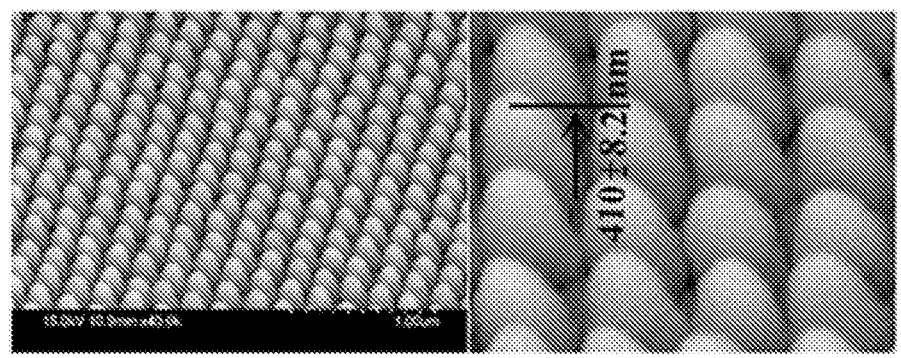
Figure 11:
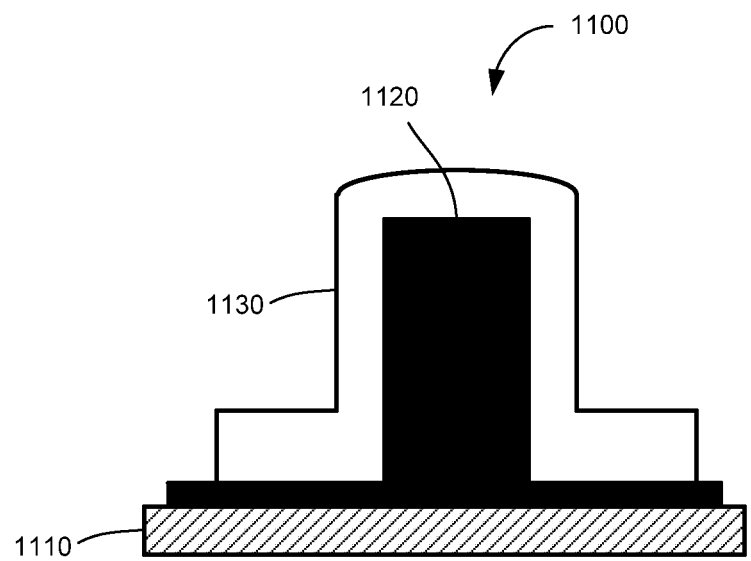
FIG. 11 is a diagram illustrating a cross-section of a coated nanopillar formed by one embodiment of the disclosed methods.

Three representative NSEs were formed by depositing 150 nm indium tin oxide (ITO), or 100 nm silver onto the PAN nanopillars (FIGS. 10A-10B, respectively). FIG. 10C is a further magnified image of the silver NSE shown in FIG. 10D. The measurements (150 nm, 100 nm) refer to the thickness of the electrode material coating measured at the top of the nanopillars. Under the deposition conditions used, the metal and metal oxide coatings were not conformal. Although the coating on top of the nanopillars and between nanopillars increased proportionally as the coating thickness increased, coating on the nanopillar side walls was considerably thinner. FIG. 11 is a diagram illustrating a cross-section of a coated nanopillar 1100 comprising a substrate 1110, a polymer nanopillar 1120, and a coating 1130 on the polymer nanopillar 1120.

Figure 12:
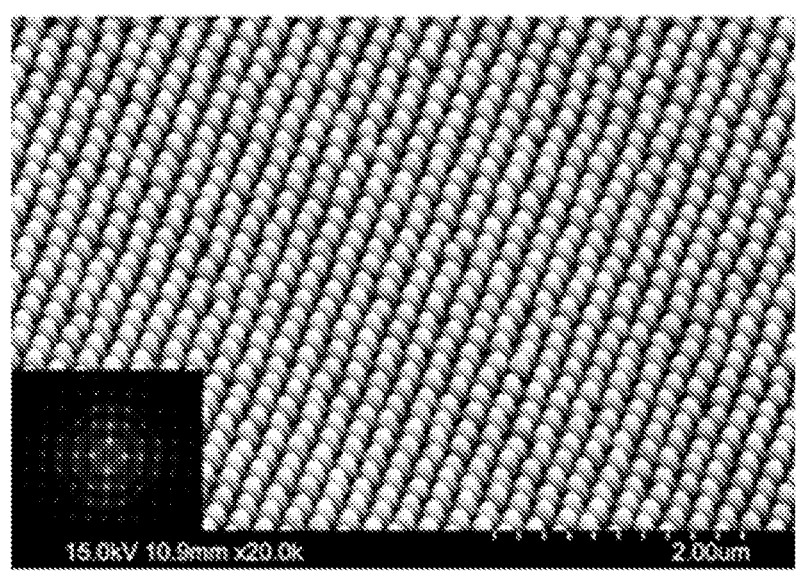
FIG. 12 is an SEM micrograph of a nanostructured electrode comprising silver-coated polyacrylonitrile nanopillars formed by one embodiment of the disclosed methods.
Figure 13:
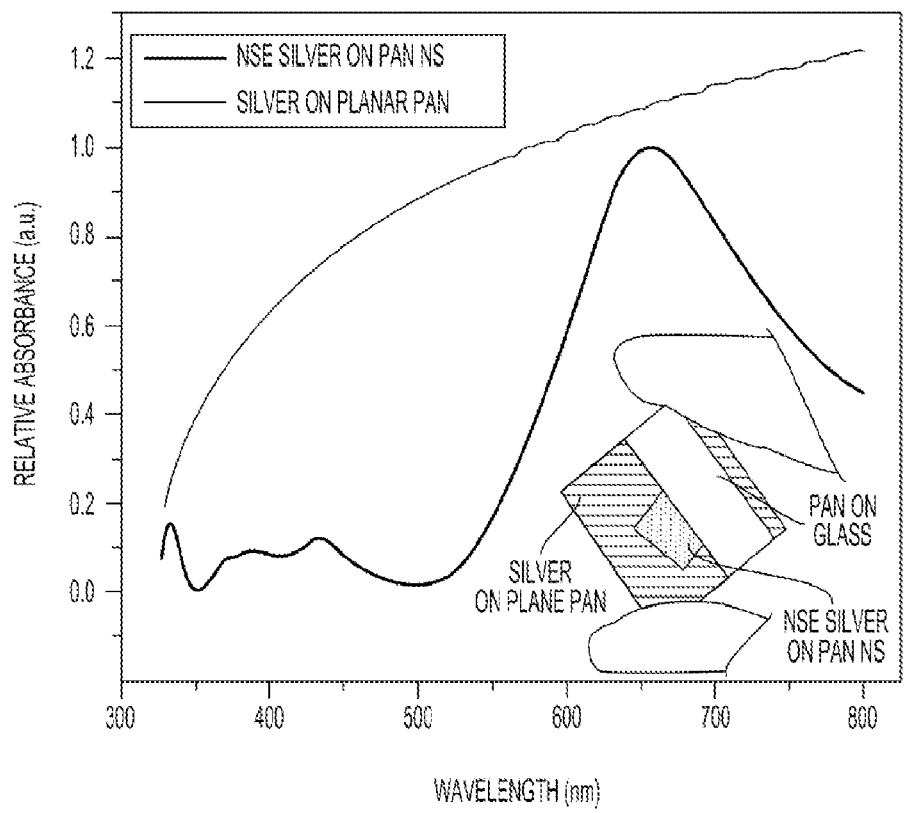
FIG. 13 shows the absorbance spectra of silver coated onto planar polyacrylonitrile and silver coated onto polyacrylonitrile nanopillars formed by one embodiment of the disclosed methods.

Another NSE was formed by coating a 47-nm silver layer on PAN nanopillars. FIG. 12 is an SEM micrograph of the silver NSE showing silver-coated nanopillars with a diameter of 152±6.2 nm, a height of 360±10 nm and a center-to-center pitch of 200±7 nm. FIG. 13 is a comparison of the absorption spectra of silver coated on planar PAN and silver coated on nanostructured PAN. The inset shows a diagram of the sample used to obtain the absorption spectra. The nanostructured silver-coated PAN exhibited an absorption peak at a particular wavelength (~650 nm), whereas the planar silver-coated PAN exhibited broad, gradually increasing absorbance with no well-defined absorption peak. The absorption peak noted for the nanostructured electrode is attributed to plasmon resonance of the silver nanostructures. The plasmonic field associated with the nanostructured silver electrode can affect charge generation. Advantageously, nanostructuring allows the plasmonic field to be tuned to a wavelength where active material does not absorb the solar energy, thereby enabling the solar cell to use portions of the solar spectrum that traditional designs cannot use. This additional solar energy allows cells with nanostructured electrodes to achieve higher efficiencies than conventional cells.

Figure 14:
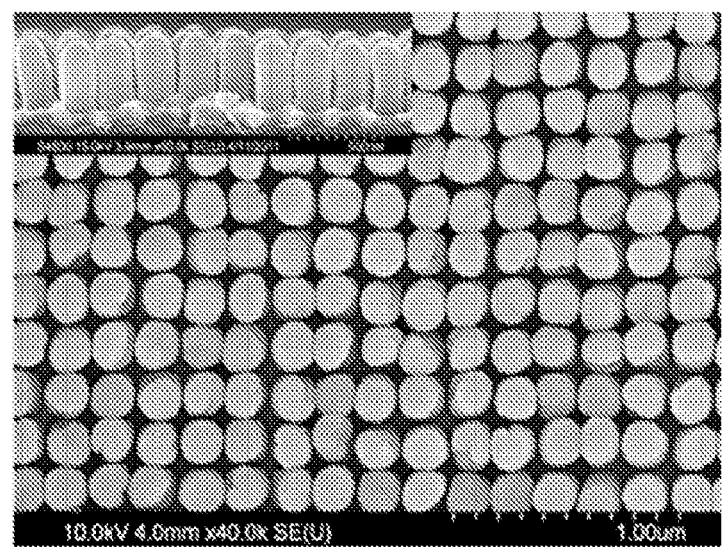
FIG. 14 is an SEM micrograph of a nanostructured electrode comprising indium tin oxide-coated nanopillars formed by one embodiment of the disclosed methods.
Figure 15:
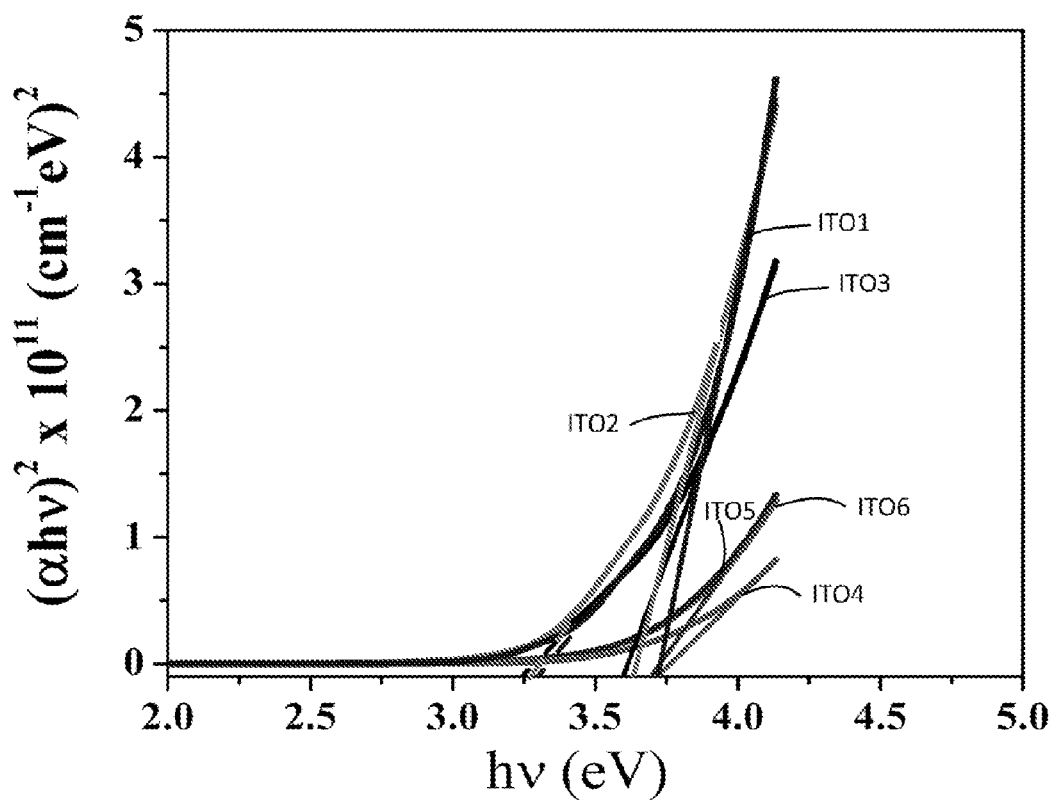
FIG. 15 is a graph comparing the optical band gap energy of indium tin oxide nanostructured electrodes formed by one embodiment of the disclosed methods to the band gap energy of indium tin oxide plain samples.
Figure 16:
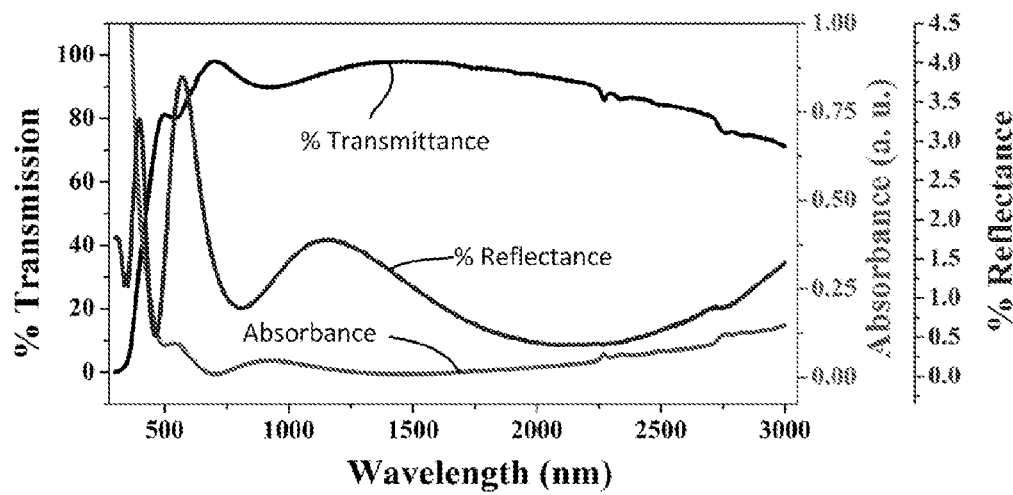
FIG. 16 is a graph showing the transmittance, absorbance, and reflectance spectra of an indium tin oxide nanostructured electrode.

Multiple NSEs were prepared by coating nanopillars with indium tin oxide (ITO). The NSEs included different thicknesses of ITO and/or different polymer nanopillar dimensions. FIG. 14 is an SEM micrograph of one ITO NSE. The coated nanopillars have a diameter of 170±8.8 nm and a height of 442±10.6 nm; the inset shows a cross section image of the NSE. FIG. 15 is a graph comparing the optical band gap energy of ITO-coated nanopillars (ITO1, ITO2, ITO3) to ITO plain samples (ITO4, ITO5, ITO6) coated under identical conditions. FIG. 15 shows that nanostructuring of the electrodes allows the optical band gap to be tuned within 0.2 to 2 eV, a tunability that is otherwise impossible to achieve without changing the electrode material itself. Tuning of the optical band gap will allow these electrodes to be better matched (energetically) with a larger number of active materials otherwise not useful with traditional flat/planar ITO electrodes. Decreasing the band gap also indicates that nanostructuring increases the carrier concentration in these electrodes by several fold, thereby making these electrodes more conducting that their planar counterparts. FIG. 16 is a graph showing the transmittance, absorbance, and reflectance spectra of an ITO NSE.

An embodiment of a method includes manufacturing a nanostructured electrode by (i) providing a reusable mold having a pattern of nano-concavities corresponding to a desired pattern of nanofeatures, (ii) filling the mold with a polymer, (iii) heating the mold at a sufficient temperature for a sufficient time period to produce a mold containing nanoarchitectured polymer comprising a plurality of convex nanofeatures corresponding to the pattern of nano-concavities, (iv) providing a coated substrate having a thin film of the polymer on a first surface of the substrate, (v) contacting the thin film of the polymer on the substrate with the mold containing the nanoarchitectured polymer such that the nanoarchitectured polymer contacts and adheres to the coated substrate in the absence of adhesive materials, (vi) removing the mold, thereby transferring the nanoarchitectured polymer from the mold to the thin film of the polymer on the substrate, and (vii) depositing a first electrode material onto the nanoarchitectured polymer to form a continuous electrode coating, thereby producing the nanostructured electrode.

In some embodiments, the nano-concavities have an average diameter of 50-150 nm and an average depth of 100-500 nm. In any or all of the above embodiments, the nano-concavities may have vertical side walls. In any or all of the above embodiments, the nano-concavities may have an aspect ratio of from 1 to 10. In any or all of the above embodiments, the nanofeatures may have a center-to-center spacing that ranges from 1× to 1.6× an average diameter of the nanofeatures. In any or all of the above embodiments, the nanofeatures may be spaced 6-300 nm apart.

In any or all of the above embodiments, contacting the thin film of the polymer on the substrate with the mold may be performed without applied pressure. In any or all of the above embodiments, the nanostructured polymer layer may comprise a plurality of nanopillars.

In any or all of the above embodiments, the substrate may have a larger surface area than the mold, wherein the larger surface area comprises one or more previously uncontacted regions of coated substrate, and the method further includes before depositing the first electrode material, for each of the one or more previously uncoated regions performing steps of: (i) refilling the mold with polymer, (ii) reheating the mold at a sufficient temperature for a sufficient time period to produce a mold containing nanoarchitectured polymer, (iii) contacting a previously uncontacted region of the coated substrate with the mold such that the nanoarchitectured polymer contacts and adheres to the previously uncontacted region of the coated substrate in the absence of adhesive material, and (iv) removing the mold, thereby transferring the nanoarchitectured polymer from the mold to the previously uncontacted region of the coated substrate.

In any or all of the above embodiments, the method may include manufacturing a commercial-scale quantity of nanostructured electrodes. In any or all of the above embodiments, the method may include manufacturing a photovoltaic cell, a light-emitting diode, or a field-effect transistor including the nanostructured electrode.

In any or all of the above embodiments, the polymer may be optically transparent at AM 1.5. In any or all of the above embodiments, the substrate may be optically transparent.

In any or all of the above embodiments, filling the mold with a polymer may include filling the mold with a solution comprising a polymer and a solvent. In some embodiments, the mold is heated at a sufficient temperature for a sufficient time period to evaporate at least a portion of the solvent, thereby producing a mold containing nanoarchitectured polymer. In some embodiments, polymer is polyacrylonitrile. In certain embodiments, the solution may comprise 1-40 wt % polyacrylonitrile, such as 20-40 wt % polyacrylonitrile in dimethylformamide. In some embodiments, the solution is heated at a sufficient temperature for a sufficient period of time to partially cyclize the polyacrylonitrile before filling the mold.

In any or all of the above embodiments, the method may further include thermally curing the nanoarchitectured polymer before depositing the first electrode material. In any or all of the above embodiments, the electrode coating may have an average thickness of 10-200 nm on top of the nanofeatures.

In any or all of the above embodiments, the method may further include depositing an organic material onto the electrode coating to produce an organic material layer, and depositing a second electrode material onto the organic material layer to produce a second electrode layer. In some embodiments, depositing the organic material includes depositing a sufficient quantity of organic material to substantially fill spaces between the nanofeatures and form a layer of organic material over the nanofeatures. In certain embodiments, the layer of organic material has a thickness of 20-200 nm over the nanofeatures, In some embodiments, the organic material is a bulk heterojunction material, such as a mixture of poly (3-hexylthiophene) (P3HT) and substituted fullerenes. In certain embodiments, the substituted fullerenes are provided by [6,6]-phenyl C61 butyric acid methyl ester (PCBM).

In some embodiments, depositing the organic material includes depositing a first organic layer comprising an organic donor material onto the electrode coating, and depositing a second organic layer comprising an organic acceptor material onto the first organic layer, wherein the first organic layer and second organic layer together comprise a sufficient quantity of organic material to fill spaces between the plurality of nanofeatures and form a layer of organic material over the nanofeatures. In certain embodiments, the organic donor material comprises phthalocyanine, oligoacenes, or a combination thereof. In certain embodiments, the organic acceptor material comprises substituted fullerenes.

In some embodiments, one of the first electrode material and the second electrode material is a hole collector material (e.g., indium tin oxide, indium zinc oxide, or silver) and the other of the first electrode material and the second electrode material is an electron collector material (e.g., aluminum).

In some embodiments, the first electrode material comprises an electron collector material and the second electrode material comprises a hole collector material, and the method further includes depositing an inorganic semiconductor material onto the electrode coating before depositing the organic material. In certain embodiments, the inorganic semiconductor material comprises Si or CdSe. In particular embodiments, the organic material is polythiophene.

In any or all of the above embodiments, the method may further include removing the nanostructured electrode from the substrate, and transferring the nanostructured electrode to another substrate for use in a photovoltaic cell, a light-emitting diode, or a field effect transistor. In some embodiments, the method further includes, before or after removing the nanostructured electrode from the substrate, cleaving the nanostructured electrode to produce a plurality of smaller nanostructured electrodes.

In one embodiment, a method includes forming a nano structured polymer scaffold that can be used for fabrication of metal and/or metal oxide electrodes, by (i) providing a reusable mold having a pattern of nano-concavities corresponding to a desired pattern of nanofeatures; (ii) providing a solution comprising 20-40 wt % polyacrylonitrile and a solvent; (iii) heating the solution at a sufficient temperature for a sufficient period of time to produce partially cyclized polyacrylonitrile; (iv) filling the mold with the partially cyclized polyacrylonitrile; (v) evaporating at least a portion of the solvent produce a mold containing nanoarchitectured polyacrylonitrile; (vi) providing a coated substrate having a thin film of polyacrylonitrile on a first surface of the substrate, wherein the substrate has a larger planar surface area than the mold; (vii) contacting a first region of the thin film of polyacrylonitrile on the substrate with the mold containing the nanoarchitectured polyacryonitrile such that the nanoarchitectured polyacrylonitrile contacts and adheres to the first region in the absence of adhesive material; (viii) removing the mold, thereby transferring the nanoarchitectured polyacrylonitrile from the mold to the first region; (ix) for each of a plurality of subsequent regions performing steps of (a) refilling the mold with partially cyclized polyacrylonitrile, (b) evaporating at least a portion of the solvent to produce a mold containing nanoarchitectured polyacrylonitrile, (c) contacting a subsequent region of the thin film of polyacrylonitrile on the substrate with the mold containing the nanoarchitectured polyacryonitrile such that the nanoarchitectured polyacrylonitrile contacts and adheres to the subsequent region in the absence of adhesive material, and (d) removing the mold, thereby transferring the nanoarchitectured polyacrylonitrile from the mold to the subsequent region; and (x) after nanoarchitectured polyacrylonitrile has been transferred to each of the plurality of subsequent regions, thermally curing the nanoarchitectured polyacrylonitrile. In some embodiments, the method further includes depositing at least one metal or metal oxide layer onto the nanostructured scaffold to form a coating, thereby producing a nanostructured electrode. In certain embodiments, the method further includes manufacturing a photovoltaic cell, a light-emitting diode, or a field-effect transistor including the nanostructured scaffold.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A method, comprising:
   manufacturing a nanostructured electrode by
      providing a reusable mold having a pattern of nano-concavities corresponding to a desired pattern of nanofeatures;
      filling the mold with a polymer;
      heating the mold at a sufficient temperature for a sufficient time period to produce a mold containing nanoarchitectured polymer comprising a plurality of convex nanofeatures corresponding to the pattern of nano-concavities;
      providing a coated substrate having a thin film of the polymer on a first surface of the substrate;
      contacting the thin film of the polymer on the substrate with the mold containing the nanoarchitectured polymer such that the nanoarchitectured polymer contacts and adheres to the coated substrate in the absence of adhesive materials;
      removing the mold, thereby transferring the nanoarchitectured polymer from the mold to the thin film of the polymer on the substrate; and
      depositing a first electrode material onto the nanoarchitectured polymer to form a continuous electrode coating, thereby producing the nanostructured electrode.

2. The method of claim 1, wherein the pattern of nano-concavities comprises nano-concavities having an average diameter of 50-150 nm and an average depth of 100-500 nm.

3. The method of claim 1, wherein contacting the thin film of the polymer on the substrate with the mold is performed without applied pressure.

4. The method of claim 1, wherein the nanostructured polymer layer comprises a plurality of nanopillars.

5. The method of claim 1, wherein the substrate has a larger surface area than the mold, wherein the larger surface area comprises one or more previously uncontacted regions of coated substrate, the method further comprising:
   before depositing the first electrode material, for each of the one or more previously uncoated regions performing steps of:
   refilling the mold with polymer,
   reheating the mold at a sufficient temperature for a sufficient time period to produce a mold containing nanoarchitectured polymer,
   contacting a previously uncontacted region of the coated substrate with the mold such that the nanoarchitectured polymer contacts and adheres to the previously uncontacted region of the coated substrate in the absence of adhesive material, and
   removing the mold, thereby transferring the nanoarchitectured polymer from the mold to the previously uncontacted region of the coated substrate.

6. The method of claim 1, wherein filling the mold with a polymer comprises filling the mold with a solution comprising a polymer and a solvent, the method further comprising heating the mold at a sufficient temperature for a sufficient time period to evaporate at least a portion of the solvent, thereby producing a mold containing nanoarchitectured polymer.

7. The method of claim 1, wherein filling the mold with a polymer comprises filling the mold with a solution comprising polyacrylonitrile and a solvent, the method further comprising heating the solution at a sufficient temperature for a sufficient period of time to partially cyclize the polyacrylonitrile before filling the mold.

8. The method of claim 1, further comprising thermally curing the nanoarchitectured polymer before depositing the first electrode material.

9. The method of claim 1, further comprising:
   depositing an organic material onto the electrode coating to produce an organic material layer; and
   depositing a second electrode material onto the organic material layer to produce a second electrode layer.

10. The method of claim 9, wherein depositing the organic material comprises depositing a sufficient quantity of organic material to substantially fill spaces between the nanofeatures and form a layer of organic material over the nanofeatures.

11. The method of claim 9, wherein the organic material is a bulk heterojunction organic material.

12. The method of claim 9, wherein depositing the organic material comprises:
depositing a first organic layer comprising an organic donor material onto the electrode coating; and
depositing a second organic layer comprising an organic acceptor material onto the first organic layer, wherein the first organic layer and second organic layer together comprise a sufficient quantity of organic material to fill spaces between the plurality of nanofeatures and form a layer of organic material over the nanofeatures.

13. The method of claim 9, wherein one of the first electrode material and the second electrode material is a hole collector material and the other of the first electrode material and the second electrode material is an electron collector material.

14. The method of claim 9, wherein the first electrode material comprises an electron collector material and the second electrode material comprises a hole collector material, the method further comprising:
depositing an inorganic semiconductor material onto the electrode coating before depositing the organic material.

15. The method of claim 1, further comprising:
depositing a first semiconductor layer onto the electrode coating;
depositing a second semiconductor layer onto the first semiconductor layer; and
depositing a second electrode material onto the second semiconductor layer to produce a second electrode layer.

16. The method of claim 15, wherein the first electrode material is a hole collector material and the second electrode material is an electron collector material.

17. The method of claim 1, further comprising:
removing the nanostructured electrode from the substrate; and
transferring the nanostructured electrode to another substrate for use in a photovoltaic cell, a light-emitting diode, or a field effect transistor.

18. The method of claim 17, further comprising:
before or after removing the nanostructured electrode from the substrate, cleaving the nanostructured electrode to produce a plurality of smaller nanostructured electrodes.

19. A method comprising:
forming a nanostructured polymer scaffold that can be used for fabrication of metal and/or metal oxide electrodes, by
providing a reusable mold having a pattern of nano-concavities corresponding to a desired pattern of nanofeatures;
providing a solution comprising 20-40 wt % polyacrylonitrile and a solvent;
heating the solution at a sufficient temperature for a sufficient period of time to produce partially cyclized polyacrylonitrile;
filling the mold with the partially cyclized polyacrylonitrile;
evaporating at least a portion of the solvent produce a mold containing nanoarchitectured polyacrylonitrile;
providing a coated substrate having a thin film of polyacrylonitrile on a first surface of the substrate, wherein the substrate has a larger planar surface area than the mold;
contacting a first region of the thin film of polyacrylonitrile on the substrate with the mold containing the nanoarchitectured polyacryonitrile such that the nanoarchitectured polyacrylonitrile contacts and adheres to the first region in the absence of adhesive material;
removing the mold, thereby transferring the nanoarchitectured polyacrylonitrile from the mold to the first region;
for each of a plurality of subsequent regions performing steps of:
refilling the mold with partially cyclized polyacrylonitrile,
evaporating at least a portion of the solvent to produce a mold containing nanoarchitectured polyacrylonitrile,
contacting a subsequent region of the thin film of polyacrylonitrile on the substrate with the mold containing the nanoarchitectured polyacryonitrile such that the nanoarchitectured polyacrylonitrile contacts and adheres to the subsequent region in the absence of adhesive material, and
removing the mold, thereby transferring the nanoarchitectured polyacrylonitrile from the mold to the subsequent region; and
after nanoarchitectured polyacrylonitrile has been transferred to each of the plurality of subsequent regions, thermally curing the nanoarchitectured polyacrylonitrile.

20. The method of claim 19, wherein the mold has a planar surface area of 10 to 20 mm$^2$ and the substrate has a planar surface area from 2× to 1,000× larger than the mold.

* * * * *